(12) United States Patent
Takada et al.

(10) Patent No.: US 9,548,127 B1
(45) Date of Patent: Jan. 17, 2017

(54) MEMORY SYSTEM

(71) Applicant: Kabushiki Kaisha Toshiba, Minato-ku (JP)

(72) Inventors: Marie Takada, Yokohama (JP); Masanobu Shirakawa, Chigasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/066,369

(22) Filed: Mar. 10, 2016

Related U.S. Application Data

(60) Provisional application No. 62/271,390, filed on Dec. 28, 2015.

(51) Int. Cl.
*G11C 16/04* (2006.01)
*G11C 16/26* (2006.01)
*G11C 11/56* (2006.01)
*G11C 16/10* (2006.01)

(52) U.S. Cl.
CPC ........... *G11C 16/26* (2013.01); *G11C 11/5642* (2013.01); *G11C 16/0483* (2013.01); *G11C 16/10* (2013.01)

(58) Field of Classification Search
CPC ..... G11C 16/26; G11C 16/0483; G11C 16/10; G11C 11/5642; G11C 16/24
USPC ............. 365/185.12, 185.17, 185.15, 185.22
See application file for complete search history.

(56) References Cited

U.S. PATENT DOCUMENTS

| 7,957,187 | B2 | 6/2011 | Mokhlesi et al. | |
|---|---|---|---|---|
| 8,777,911 | B2 * | 7/2014 | Heagle | A61F 13/02 604/317 |
| 9,230,677 | B2 * | 1/2016 | Lee | G11C 11/56 |
| 2009/0267128 | A1 | 10/2009 | Maejima | |
| 2009/0268522 | A1 | 10/2009 | Maejima | |
| 2010/0207195 | A1 | 8/2010 | Fukuzumi et al. | |
| 2011/0305089 | A1 | 12/2011 | Abe et al. | |
| 2013/0148436 | A1 | 6/2013 | Kurosawa | |
| 2015/0003151 | A1 * | 1/2015 | Lee | G11C 16/10 365/185.02 |
| 2015/0078086 | A1 * | 3/2015 | Lee | G11C 16/0483 365/185.11 |

FOREIGN PATENT DOCUMENTS

| JP | 2010-515203 | 5/2010 |
|---|---|---|
| JP | 2011-258289 | 12/2011 |
| JP | 2013-122804 | 6/2013 |

* cited by examiner

*Primary Examiner* — Gene Auduong
(74) *Attorney, Agent, or Firm* — Oblon, McClelland, Maier & Neustadt, L.L.P.

(57) ABSTRACT

According to one embodiment, a memory system includes: a semiconductor memory device and a controller. The semiconductor memory device reads data a plurality of times from a first area, performs a majority operation on the read results, and transmits data based on the majority operation result to the controller as read data.

18 Claims, 20 Drawing Sheets

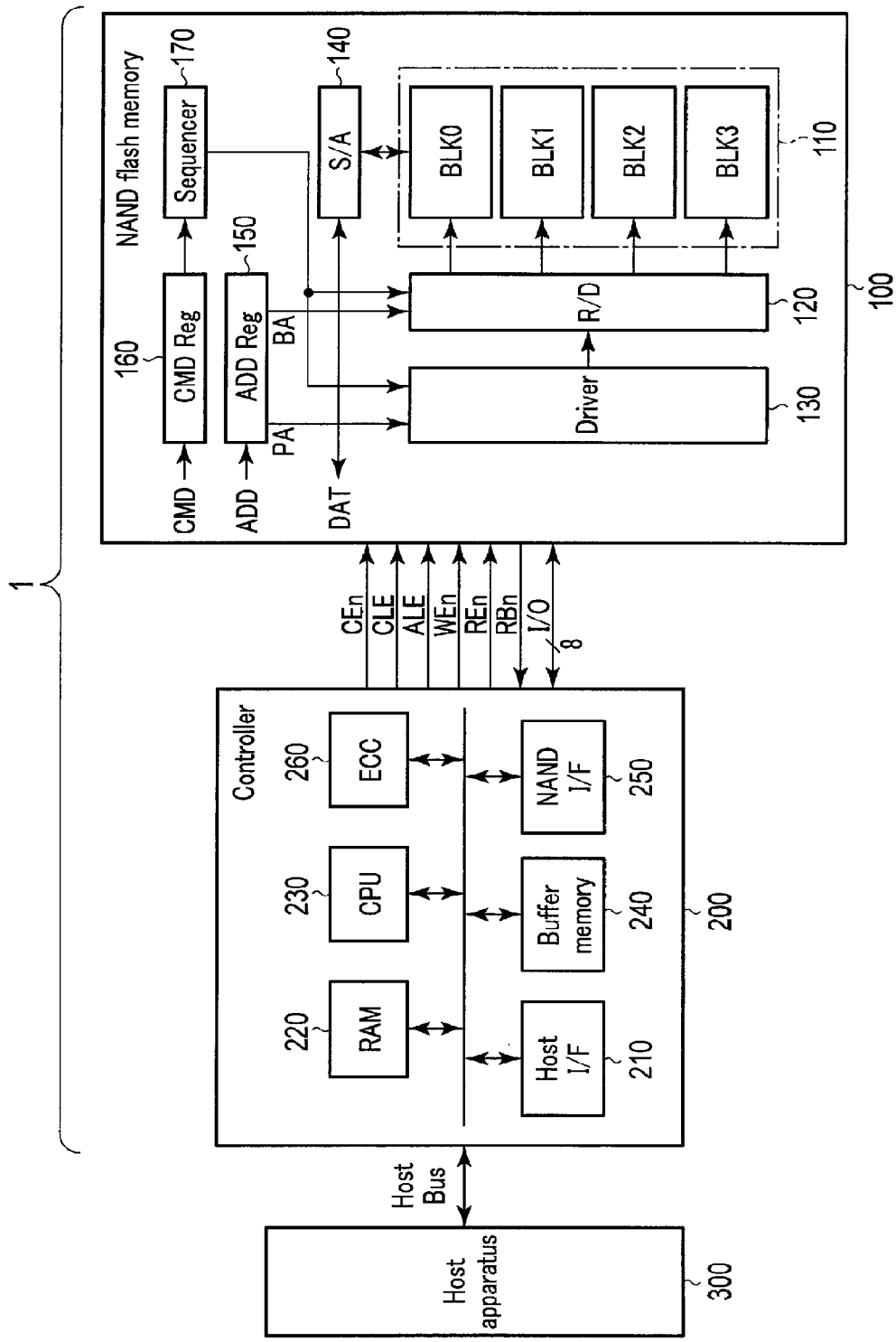
F I G. 1

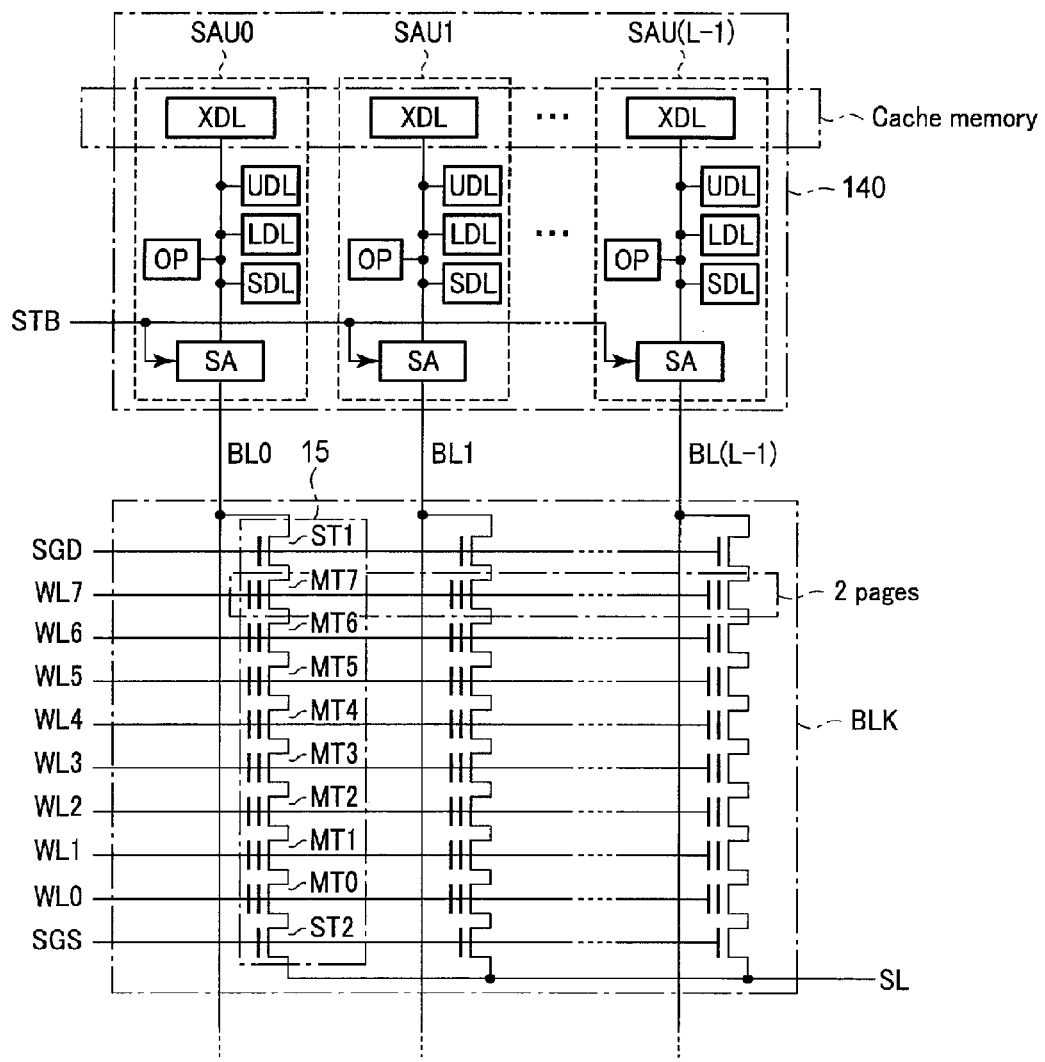
F I G. 2

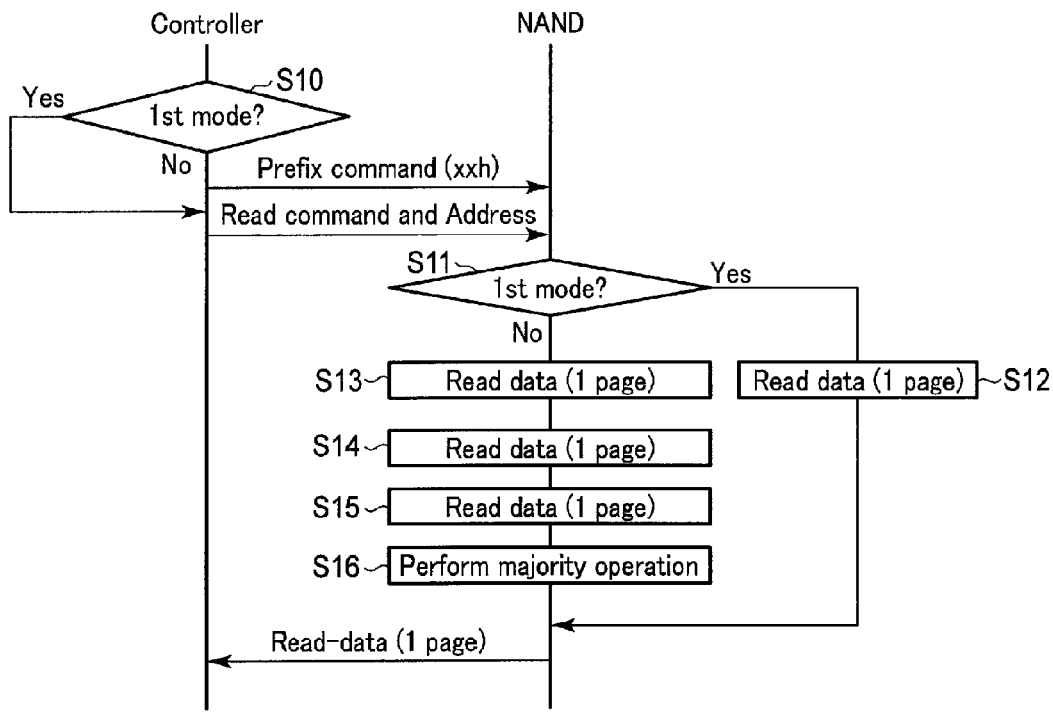
F I G. 3
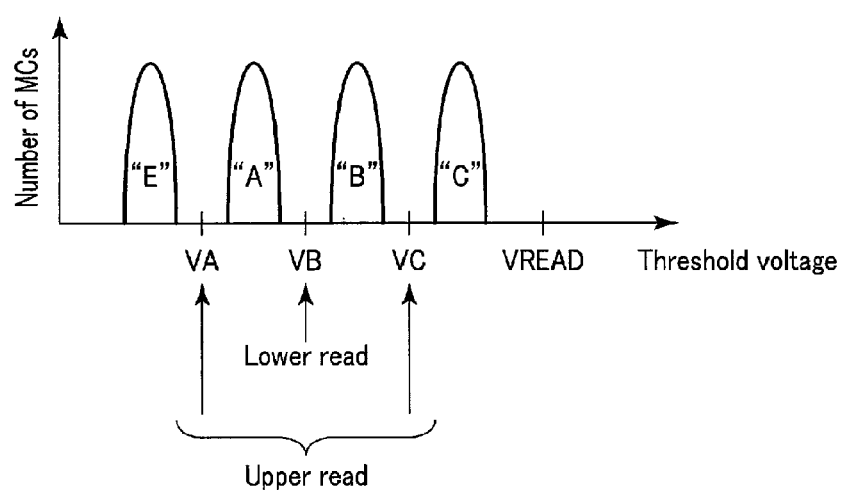
F I G. 4

| Case | I | II | III | IV | V | VI | VII | VIII |
|---|---|---|---|---|---|---|---|---|
| 1st read | 0 | 1 | 0 | 1 | 0 | 1 | 0 | 1 |
| 2nd read | 0 | 0 | 1 | 1 | 0 | 0 | 1 | 1 |
| 3rd read | 0 | 0 | 0 | 0 | 1 | 1 | 1 | 1 |
| Fixed data | 0 | 0 | 0 | 1 | 0 | 1 | 1 | 1 |
F I G. 13
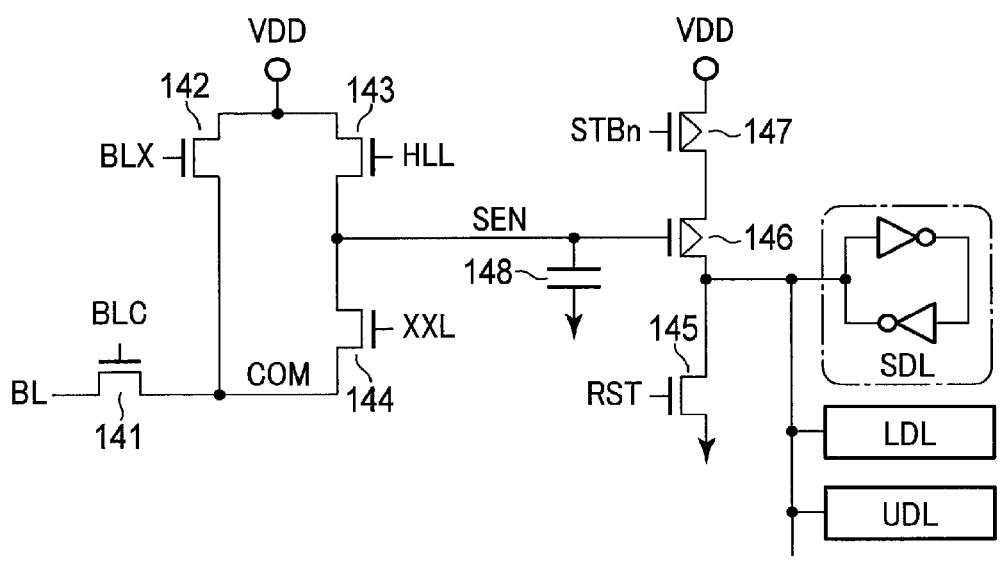
F I G. 14

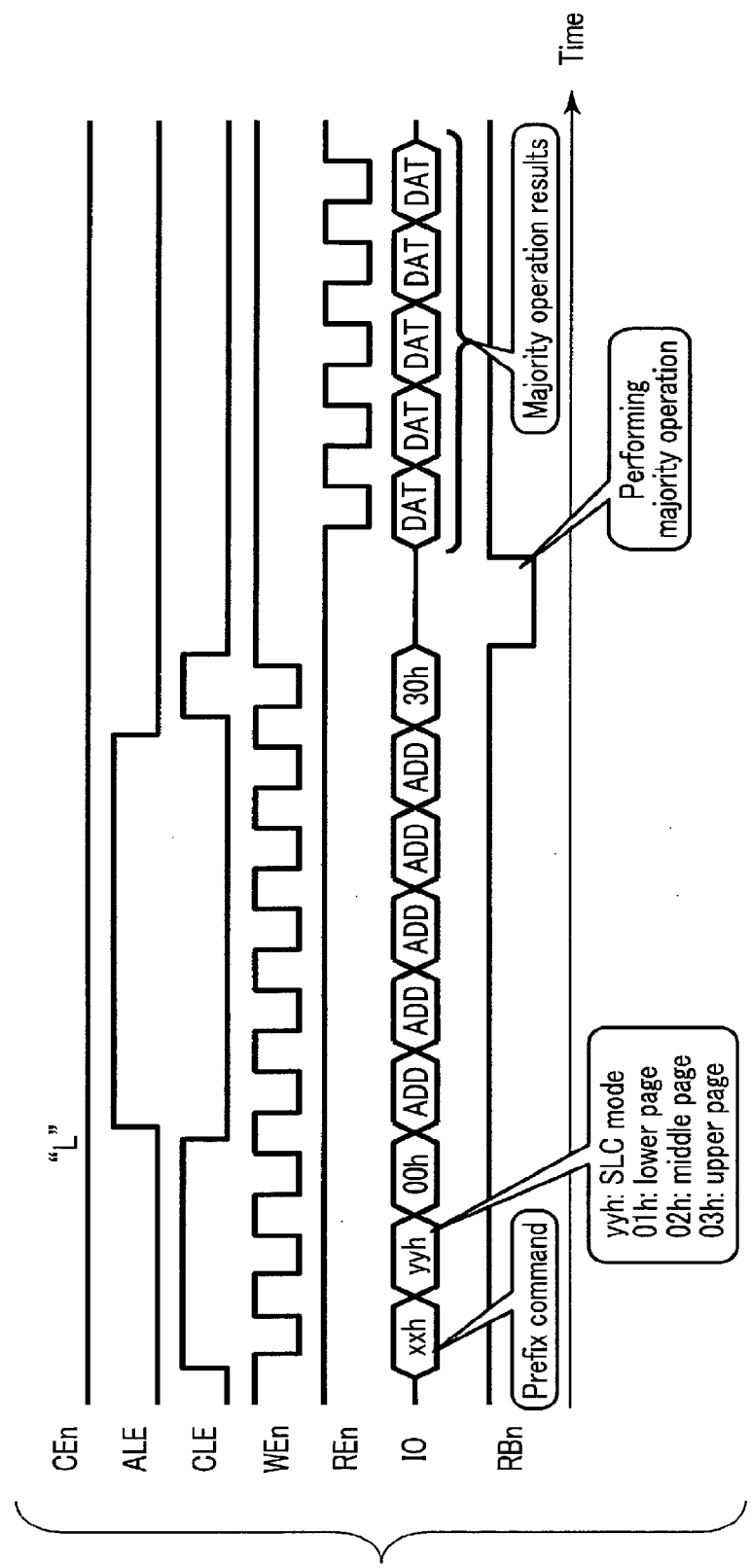
F I G. 16

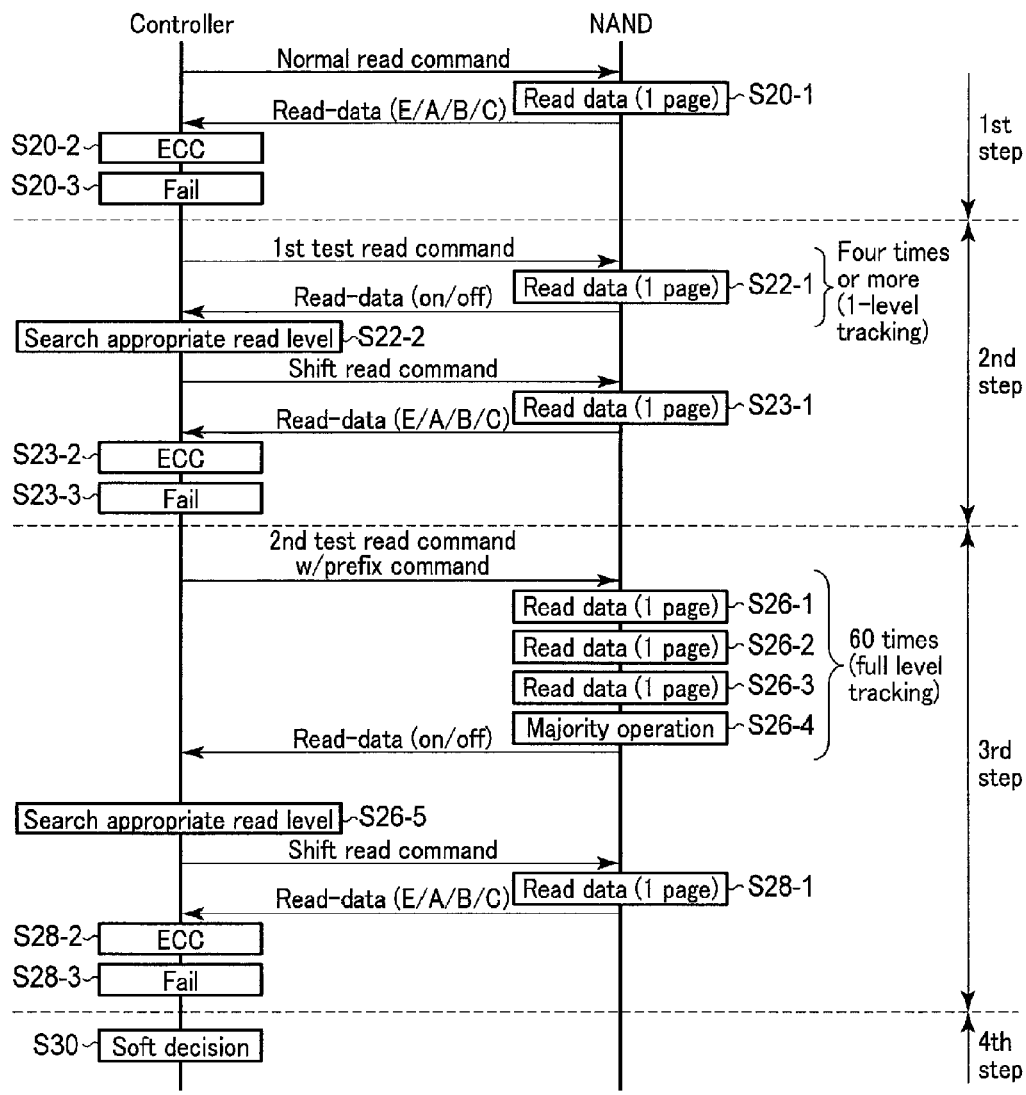
F I G. 21

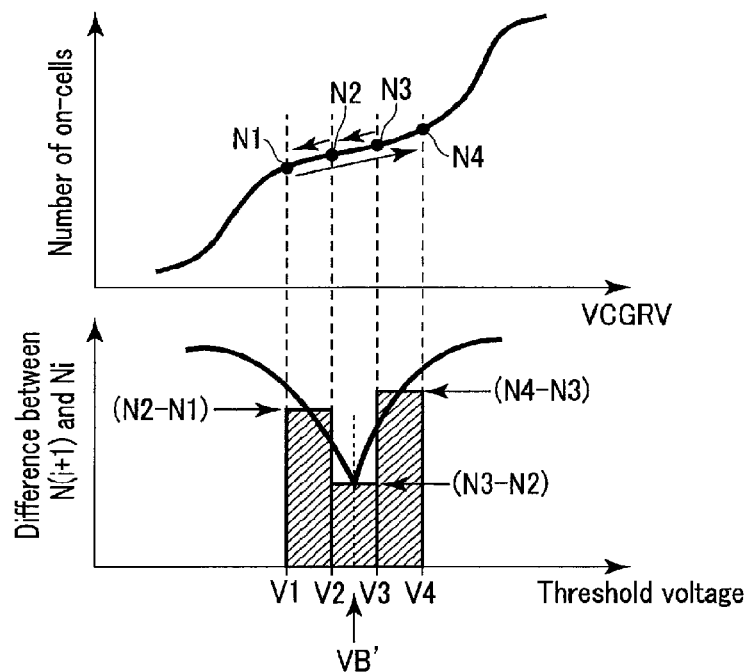
F I G. 24
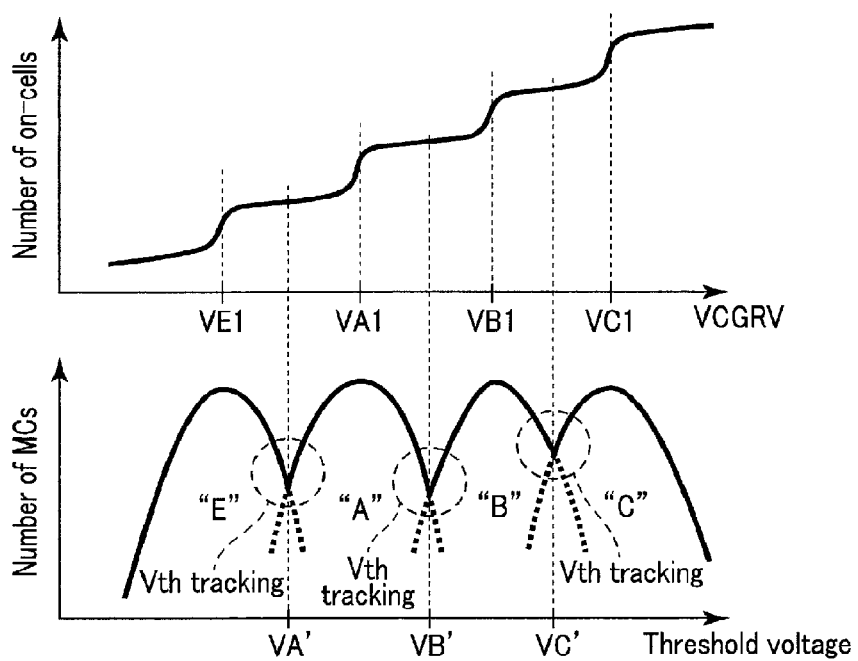
F I G. 25

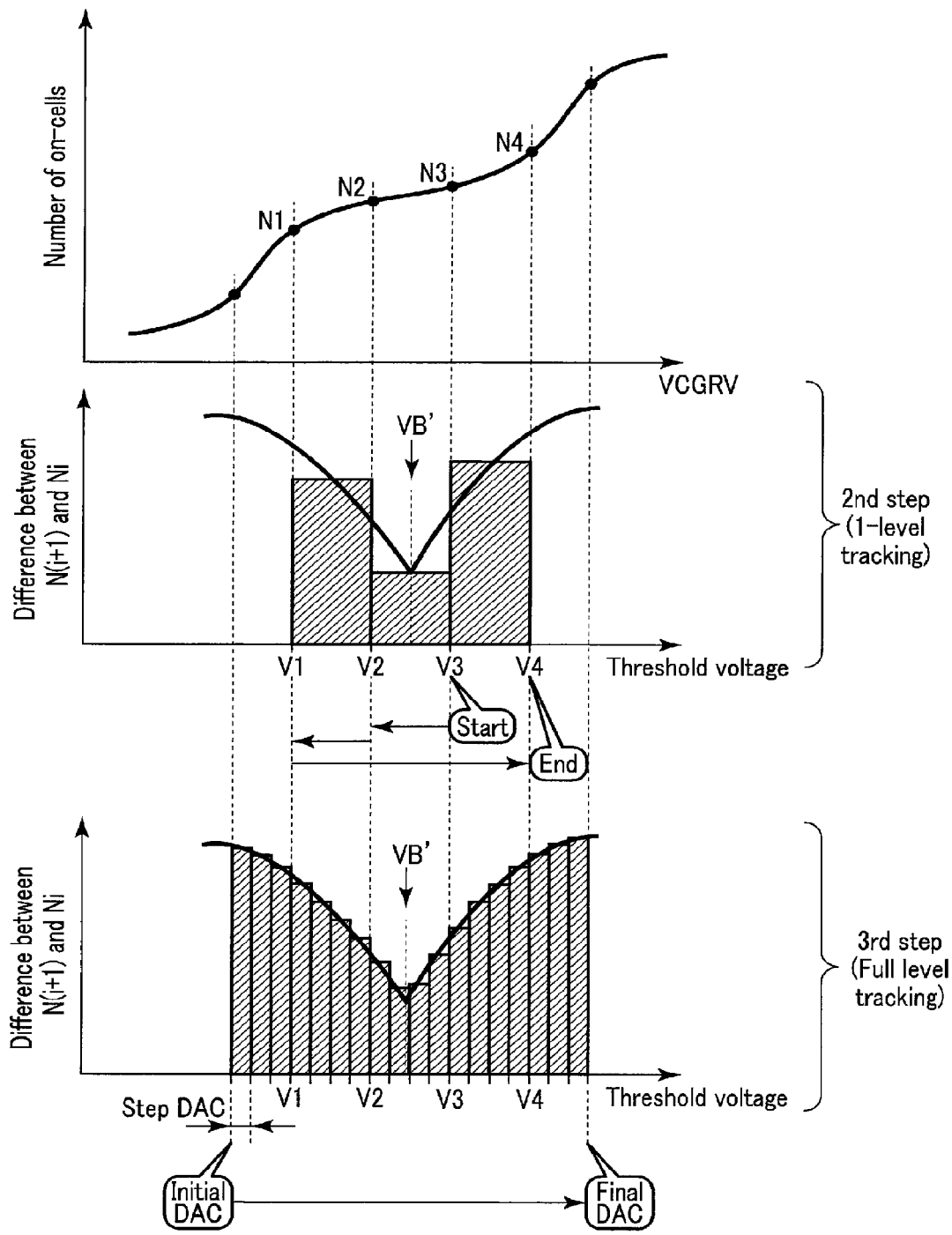
F I G. 26

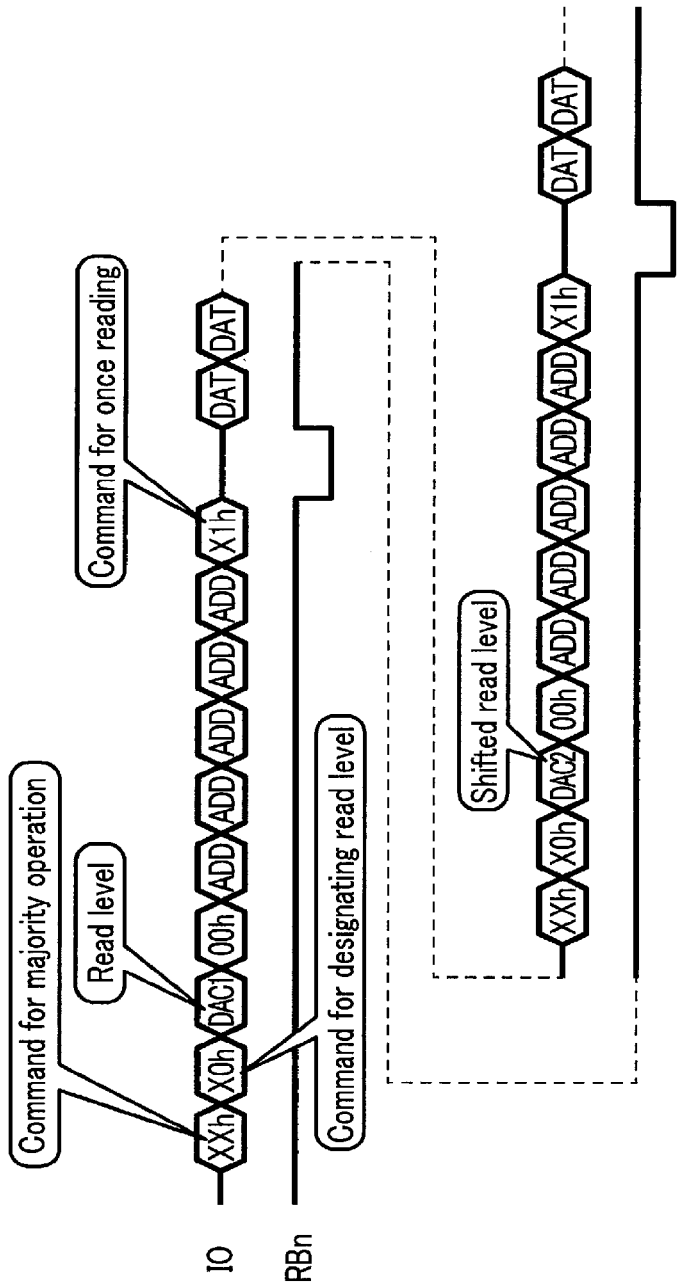
F I G. 27

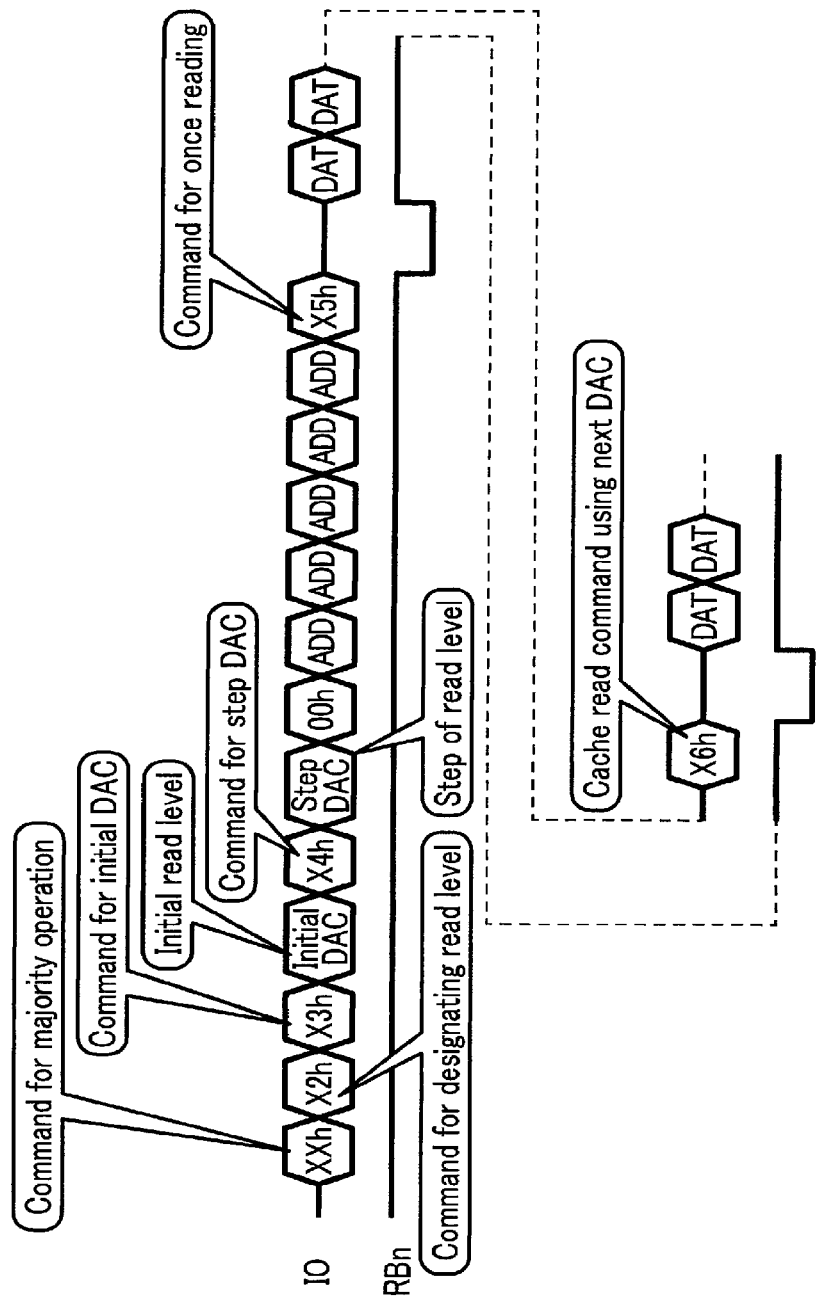
F I G. 28

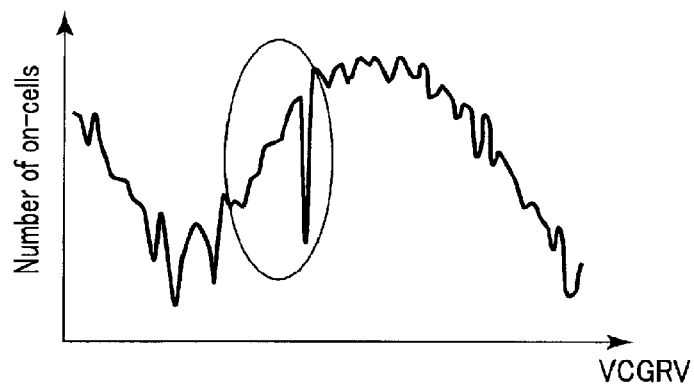
F I G. 29
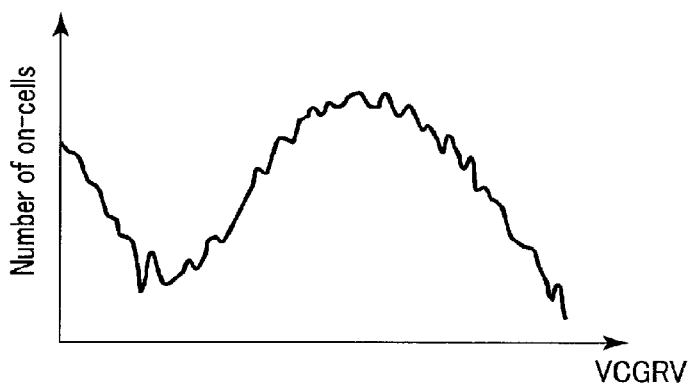
F I G. 30
F I G. 31
| Case | I | II | III | IV | V | VI | VII | VIII |
|---|---|---|---|---|---|---|---|---|
| 1st read | 0 | 1 | 0 | 1 | 0 | 1 | 0 | 1 |
| 2nd read | 0 | 0 | 1 | 1 | 0 | 0 | 1 | 1 |
| 3rd read | 0 | 0 | 0 | 0 | 1 | 1 | 1 | 1 |
| Fixed data | 0 | 1 | 1 | 1 | 1 | 1 | 1 | 1 |
F I G. 32
| Case | I | II | III | IV | V | VI | VII | VIII |
|---|---|---|---|---|---|---|---|---|
| 1st read | 0 | 1 | 0 | 1 | 0 | 1 | 0 | 1 |
| 2nd read | 0 | 0 | 1 | 1 | 0 | 0 | 1 | 1 |
| 3rd read | 0 | 0 | 0 | 0 | 1 | 1 | 1 | 1 |
| Fixed data | 0 | 0 | 0 | 0 | 0 | 0 | 0 | 1 |

MEMORY SYSTEM

CROSS-REFERENCE TO RELATED APPLICATIONS

This application claims the benefit of U.S. Provisional Application No. 62/271,390, filed Dec. 28, 2015, the entire contents of which are incorporated herein by reference.

FIELD

Embodiments described herein relate generally to a memory system.

BACKGROUND

A NAND flash memory is widespread as a data storage device.

BRIEF DESCRIPTION OF THE DRAWINGS

FIG. 1 is a block diagram of a memory system according to a first embodiment;
FIG. 2 is a circuit diagram of a memory cell array and a sense amplifier according to the first embodiment;
FIG. 3 is a flowchart illustrating a read operation in the memory system according to the first embodiment;
FIG. 4 is a graph illustrating a possible threshold distribution for memory cells according to the first embodiment;
FIG. 13 is a diagram illustrating a majority operation according to the first embodiment;
FIG. 14 is a circuit diagram of a sense amplifier according to a second embodiment;
FIGS. 15 to 19 are timing charts of various signals during a read operation according to the second embodiment;
FIGS. 20 and 21 are flowcharts illustrating a read level search method according to a third embodiment;
FIG. 23 and FIG. 24 are conceptual drawings illustrating 1-level tracking according to a third embodiment;
FIG. 25 and FIG. 26 are conceptual drawings of full-level tracking according to the third embodiment;
FIG. 27 and FIG. 28 are command sequences for a distribution read;
FIG. 29 is a graph illustrating a relation between a read voltage and the number of ON-cells;
FIG. 30 is a graph illustrating a relation between the read voltage and the number of ON-cells in a memory system according to the third embodiment;
and
FIG. 31 and FIG. 32 are diagrams illustrating a majority operation according to a modification of the first to third embodiment.

DETAILED DESCRIPTION

Figure 5:
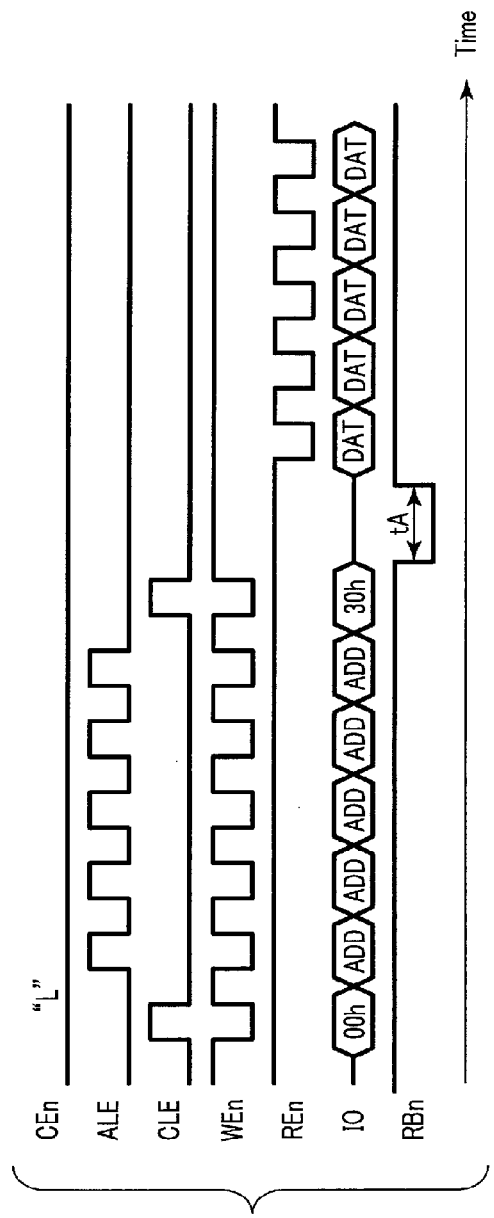
FIGS. 5 to 8 are timing charts of various signals during the read operation according to the first embodiment.

In general, according to one embodiment, a memory system includes a semiconductor memory device including a memory cell array including memory cells capable of holding data; and a controller configured to control the semiconductor memory device. The semiconductor memory device reads data a plurality of times from a first area designated by a first address in the memory cell array in response to a first read instruction from the controller, performs a majority operation on the read results, and transmits data based on the majority operation result to the controller as read data from the first area.

1. First Embodiment

A memory system according to a first embodiment will be described. By way of example, a memory system which will be described below comprises a NAND flash memory two-dimensionally arranged on a semiconductor substrate.

1. 1 Configuration 1.1. 1 Overall Configuration of the Memory System

First, a general overall configuration of a memory system according to the present embodiment will be described using FIG. 1. FIG. 1 is a block diagram of the memory system according to the present embodiment.

As depicted in FIG. 1, a memory system 1 includes a NAND flash memory 100 and a controller 200. The NAND flash memory 100 and the controller 200 may be, for example, combined together so as to form one semiconductor device. Examples of such a semiconductor device include a memory card such as an SD™ card and an SSD (solid state drive).

The NAND flash memory 100 includes a plurality of memory cells to store data in a nonvolatile manner. The controller 200 is connected to the NAND flash memory 100 by a NAND bus and to host apparatus 300 by a host bus. The controller 200 controls the NAND flash memory 100 and accesses the NAND flash memory 100 in response to an instruction received from the host apparatus 300. The host apparatus 300 is, for example, a digital camera or a personal computer, and the host bus is a bus compliant with, for example, an SD™ interface.

The NAND bus transmits and receives signals in accordance with a NAND interface. Specific examples of the signals include a chip enable signal CEn, an address latch enable signal ALE, a command latch enable signal CLE, a write enable signal WEn, a read enable signal REn, a ready busy signal RBn, and a input/output signal I/O.

The signal CEn is a signal for enabling the NAND flash memory 100 and is asserted at a low level. The signals CLE and ALE are signals that notify the NAND flash memory 100 that the input signal I/O to the NAND flash memory 100 is a command and an address, respectively. The signal WEn is a signal asserted at a low level to load the input signal I/O into the NAND flash memory 100. The signal REn is a signal also asserted at a low level to read the output signal I/O from the NAND flash memory 100. The ready busy signal RBn is a signal indicating whether the NAND flash memory 100 is in a ready state (the state where the NAND flash memory 100 can receive instructions from the controller 200) or in a busy state (the state where the NAND flash memory 100 fails to receive instructions from the controller 200). The ready busy signal at the low level is indicative of the busy state. The input/output signal I/O is, for example, 8-bit signal. The input/output signal I/O can be the contents of data transmitted and received between the NAND flash memory 100 and the controller 200 and include a command, an address, write data, and read data.

1. 1. 2 Configuration of the Controller 200

Further using FIG. 1, details of the configuration of the controller 200 will be described. As shown in FIG. 1, the controller 200 includes a host interface circuit 210, an embedded-memory (RAM) 220, a processor (CPU) 230, a buffer memory 240, a NAND interface circuit 250, and an ECC circuit 260.

The host interface circuit 210 is connected to the host apparatus 300 via the host bus to transfer an instruction and data received from the host apparatus 300 to the processor 230 and the buffer memory 240, respectively. Furthermore, the host interface circuit 210 transfers data in the buffer memory 240 to the host apparatus 300 in response to an instruction from the processor 230.

The processor 230 controls operations of the entire controller. For example, upon receiving a write instruction from the host apparatus 300, the processor 230, in response to the write instruction, issues a write instruction to the NAND interface circuit 250. The processor 230 operates similarly for reading and erasing. Furthermore, the processor 230 executes various processes for managing the NAND flash memory 100 such as wear leveling.

The NAND interface circuit 250 is connected to the NAND flash memory 100 via the NAND bus to communicate with the NAND flash memory 100. Based on instructions received from the processor 230, the NAND interface circuit 250 outputs the signals CEn, ALE, CLE, WEn, and REn to the NAND flash memory 100. Furthermore, in data writing, the NAND interface circuit 250 transfers a write command issued by the processor 230 and write data in the buffer memory 240 to the NAND flash memory 100 as the input signal I/O. Moreover, in data reading, the NAND interface circuit 250 transfers a read command issued by the processor 230 to the NAND flash memory 100 and further receives read data from the NAND flash memory 100 as the output signal I/O, and transfers the read data to the buffer memory 240.

The buffer memory 240 temporarily holds write data and read data.

The embedded-memory 220 is a semiconductor memory, for example, a DRAM and is used as a work area for the processor 230. The embedded-memory 220 holds firmware, various management tables, and the like that are used to manage the NAND flash memory 100.

The ECC circuit 260 executes an error detection and error correction process on read data. During data writing, the ECC circuit 260 generates parities based on net data received from the host apparatus 300. The net data and the parities are written to the NAND flash memory 100. During data reading, the ECC circuit 260 generates a syndrome based on the read parities to determine whether or not the data contains an error. If the data contains an error, the ECC circuit 260 determines the position of the error and corrects the error. However, the number of error bits that can be corrected in the ECC circuit 260 is determined by, for example, the number of parity bits. When the data contains error bits the number of which is larger than the number of error bits that can be corrected, the ECC circuit 260 fails to correct the data, leading to a failure in reading of the data.

1. 1. 3 Configuration of the NAND Flash Memory 100

1. 1. 3. 1 Overall Configuration of the NAND Flash Memory 100

Now, a configuration of the NAND flash memory 100 will be described. As shown in FIG. 1, the NAND flash memory 100 includes a memory cell array 110, a row decoder 120, a driver circuit 130, a sense amplifier 140, an address register 150, a command register 160, and a sequencer 170.

The memory cell array 110 includes, for example, four blocks BLK (BLK0 to BLK3) that are sets of a plurality of nonvolatile memory cells associated with rows and columns. The memory cell array 110 stores data provided by the controller 200.

The row decoder 120 selects one of the blocks BLK0 to BLK3 and further selects a row direction for the selected block BLK.

The driver circuit 130 supplies a voltage to the selected block BLK via the row decoder 120.

During data reading, the sense amplifier 140 senses the read data from the memory cell array 110 and executes the required calculations. The sense amplifier 140 outputs the data DAT to the controller 200. During data writing, the sense amplifier 140 transfers the write data DAT received from the controller 200 to the memory cell array 110.

The address register 150 holds an address ADD received from the controller 200. The command register 160 holds a command CMD received from the controller 200.

The sequencer 170 controls operations of the whole NAND flash memory 100 based on the command CMD held in the command register 160.

1. 1. 3. 2 Configuration of the Block BLK

Now, a configuration of the block BLK will be described using FIG. 2. FIG. 2 is a circuit diagram of the block BLK and the sense amplifier 140.

As shown in FIG. 2, the block BLK includes a plurality of NAND strings 15. Each of the NAND strings 15 includes, for example, eight memory cell transistors MT (MT0 to MT7) and selection transistors ST1 and ST2. Each of the memory cell transistors MT includes a control gate and a charge accumulation layer, and holds data in a nonvolatile manner. The memory cell transistors MT are connected together in series between a source of the selection transistor ST1 and a drain of the selection transistor ST2.

Gates of the selection transistors ST1 and ST2 in the same block are all connected to selection gate lines SGD and SGS, respectively. Similarly, control gates of the memory cell transistors MT0 to MT7 in the same block are all connected to word lines WL0 to WL7, respectively.

Furthermore, in the memory cell array 110, drains of the selection transistor ST1 in the NAND strings 15 in the same column are all connected to a bit line BL (BL0 to BL(L−1); (L−1) is a natural number of 1 or larger). That is, the bit line BL connects the NAND strings 15 in the plurality of blocks BLK together. Moreover, sources of the plurality of selection transistors ST2 are all connected to a source line SL.

In the present example, one memory cell transistor MT can hold, for example, 2-bit data including a lower bit and an upper bit. A set of lower bits held by the memory cells connected to the same word line is referred to as a lower page. A set of upper bits held by the memory cells connected to the same word line is referred to as an upper page. In other words, two pages are assigned to one word line WL, and the block BLK, including eight word lines WL, has a capacity equivalent to 16 pages. In other words, "page" can be defined as a part of a memory space defined by the memory cells connected to the same word line. Data writing and data reading may be performed on each page (this reading method is referred to as page-by-page reading). Furthermore, data erasing is performed in units of blocks BLK.

The memory cell array 110 may be configured such that memory cell transistors are three-dimensionally stacked above a semiconductor substrate. Such a configuration is described in, for example, U.S. patent application Ser. No. 12/407,403 filed on Mar. 19, 2009 and entitled "THREE DIMENSIONAL STACKED NONVOLATILE SEMICONDUCTOR MEMORY." The configuration is also described in U.S. patent application Ser. No. 12/406,524 filed on Mar.

18, 2009 and entitled "THREE DIMENSIONAL STACKED NONVOLATILE SEMICONDUCTOR MEMORY", U.S. patent application Ser. No. 12/679,991 filed on Mar. 25, 2010 and entitled "NON-VOLATILE SEMICONDUCTOR STORAGE DEVICE AND METHOD OF MANUFACTURING THE SAME", and U.S. patent application Ser. No. 12/532,030 filed on Mar. 23, 2009 and entitled "SEMICONDUCTOR MEMORY AND METHOD FOR MANUFACTURING SAME". These patent applications are entirely incorporated herein by reference.

1. 1. 3. 3 Configuration of the Sense Amplifier 140

Further using FIG. 2, a configuration of the sense amplifier 140 will be described. As shown in FIG. 2, the sense amplifier 140 includes sense amplifier units SAU (SAU0 to SAU(L-1)) for the respective bit lines BL.

Each of the sense amplifier units SAU includes a sense amplifier section SA, a calculation section OP, and for example, four latch circuits SDL, LDL, UDL, and XDL.

The sense amplifier section SA senses data read onto the corresponding bit line BL, and applies a voltage to the bit line BL according to write data. That is, the sense amplifier section SA is a module that directly controls the bit line BL. The sense amplifier section SA is provided with a control signal STB by the sequencer 170. The sense amplifier section SA determines read data ("0" or "1") at a timing when the signal STB is asserted and transfers the read data to one of the latch circuits SDL, LDL, and UDL.

The latch circuits SDL, LDL, and UDL temporarily hold read data and write data. The calculation section OP executes various logical operations such as an inversion (NOT) operation, a logical sum (OR) operation, a logical product (AND) operation, and an exclusive OR (XOR) operation.

The sense amplifier section SA, the latch circuits SDL, LDL, and UDL, and the calculation section OP are connected together by a bus so as to be able to transmit and receive data. The bus is further connected to the latch circuit XDL.

Input and output of data to and from the sense amplifier 140 are performed via the latch circuit XDL. That is, data received from the controller 200 is transferred to the latch circuits SDL, LDL, UDL, or the sense amplifier section SA via the latch circuit XDL. Furthermore, data in the latch circuit SDL, LDL, UDL, or the sense amplifier section SA is transferred to the controller 200 via the latch circuit XDL. The latch circuit XDL functions as a cache memory for the NAND flash memory 100. Therefore, even when the latch circuits SDL, LDL, and UDL are in use, the NAND flash memory 100 can be set to the ready state when the latch circuit XDL is available.

1. 2 Data Reading Operation

Now, a read operation in the memory system according to the present embodiment will be described.

1. 2. 1 Overall Flow

First, an overall flow of the read operation will be described using FIG. 3. FIG. 3 is a flowchart illustrating operations of the controller 200 and the NAND flash memory 100 during data reading.

The memory system according to the present embodiment has a first mode and a second mode for the read operation. As shown in FIG. 3, the controller 200, when selecting a second mode (step S10, NO), issues a prefix command (for example, "xxh") that instructs the NAND flash memory 100 to perform a read operation in the second mode, and when selecting the first mode (step S10, YES), does not issue the prefix command. Subsequently, the controller 200 issues and transmits a read command and an address to the NAND flash memory 100.

The NAND flash memory 100 allows the command register 160 to hold the received command. Then, the sequencer 170 operates in the second mode when the prefix command is held in the command register 160 and operates in the first mode when the prefix command is not held in the command register 160.

When the NAND flash memory 100 receives the read command, any of the word lines WL in the block designated by the received address is selected, and data is read in units of pages (in the case of page-by-page reading). The data is sensed by the sense amplifier section SA and held by any of the latch circuits (for example, SDL).

When the NAND flash memory 100 is operating in the first mode (step S11, YES), data is read from the designated address once (step S12). Then, data in the latch circuit SDL is transferred to the latch circuit XDL. One page of data read from the memory cell array 110 is transmitted to the controller 200.

When the NAND flash memory 100 is operating in the second mode (step S11, NO), data is read from the designated address, for example, three times (steps S13 to S15). That is, in response to receiving one read command, the NAND flash memory 100 repeats reading of data from the same area designated by the address signal, three times. The sense amplifier 140 performs a majority operation on results of three data read operations for each bit line (step S16). A result of the majority operation is transmitted to the controller 200 as one page of read data.

1. 2. 2 Details of the Reading Operation (First Mode)

Now, details of the read operation will be described. FIG. 4 is a graph illustrating a possible threshold distribution for the memory cell transistors and voltages used during reading.

As described above, each of the memory cell transistors MT can hold 2-bit data according to a threshold voltage. Data represented by the 2 bits are referred to as an "E" level, an "A" level, a "B" level, and a "C" level in ascending order of threshold voltage.

A threshold voltage for the memory cell transistors MT holding the "E" level is lower than a voltage VA and corresponds to a data erase state. A threshold voltage for the memory cell transistors MT holding the "A" level is equal to or higher than the voltage VA and lower than a voltage VB (>VA). A threshold voltage for the memory cell transistors MT holding the "B" level is equal to or higher than the voltage VB and lower than a voltage VC (>VB). A threshold voltage for the memory cell transistors MT holding the "C" level is equal to or higher than the voltage VC and is lower than a voltage VREAD. Among the 2-bit data, the "C" level corresponds to data for the highest threshold.

In the case of page-by-page reading, the upper page is read using, for example, the voltages VA and VC as read voltages. That is, for example, the upper page reading allows determination of whether the held data is at the "E" level or at one of the "A" to "C" levels and determination of whether the held data is at the "C" level or at one of the "E" to "B" levels. Furthermore, the lower page is read using the voltage VB. The lower page reading allows determination of whether the held data is at the "E" or "A" level or at the "B" to "C" level.

First, the first mode will be described. FIG. 5 is a timing chart of signals on the NAND bus during the read operation in the first mode.

As shown in FIG. 5, upon selecting the first mode, the controller 200 issues a normal first read command "00h" defined in the NAND interface and asserts the signal CLE. Subsequently, the controller 200 issues addresses (including a column address, a block address, and a page address) and asserts the signal ALE, for example, for 5 cycles. Thereafter, the controller 200 issues a second read command "30h" and asserts the signal CLE.

When the command "30h" is set in the command register 160, the NAND flash memory 100 starts an operation of reading data from the memory cell array 110 and is set to the busy state. Then, one page of data is read from an area corresponding to the addresses transmitted from the controller 200, and is held in the latch circuit XDL.

Thereafter, when the NAND flash memory 100 is set to the ready state, the controller 200 repeatedly asserts the signal REn. Each time the signal REn is toggled, the data read from the memory cell array 110 is transmitted to the controller 200.

Figure 6:
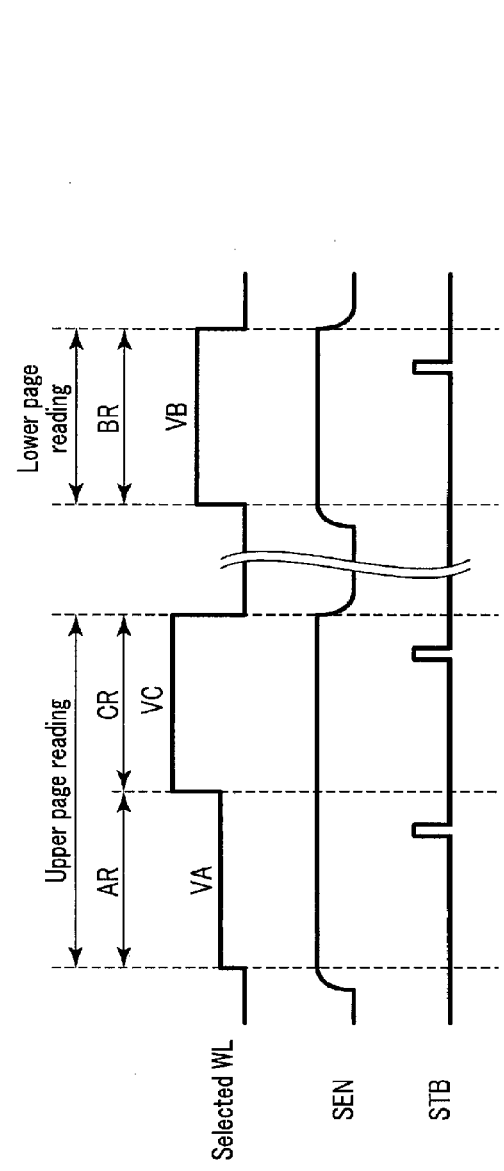

FIG. 6 is a timing chart of a selected word line WL, a node SEN, and the signal STB in the NAND flash memory 100 during the read operation in the first mode. The node SEN is a node included in the sense amplifier section SA. A potential at the node SEN fluctuates depending on whether the corresponding memory cell transistor MT connected to the selected word line WL is in an ON-state or an OFF-state. Whether the data is "0" or "1" is determined according to the amount of the fluctuation.

FIG. 6 illustrates, by way of example, a case where, in page-by-page reading, first the upper page is read and then the lower page is read.

As shown in FIG. 6, the upper page reading includes the read operation using the voltages VA and VC, and involves sequentially applying the voltages VA and VC to the selected word line WL. Operations in which data is read by applying the voltages VA and VC are referred to as read operations AR and CR, respectively. In the upper page reading, the STB is asserted once during the read operation AR. Then, based on the data determined at this timing, the memory cell transistors MT holding the "E" level are identified. Moreover, the STB is asserted once during the read operation CR. Then, based on the data determined at this timing, the memory cell transistors MT holding the "C" level are identified.

The lower page reading includes the read operation using the voltage VB, and involves applying the voltage VB to the selected word line WL. An operation in which data is read by applying the voltage VB is referred to as a read operation BR. Then, the STB is asserted once during the read operation BR. Based on the data determined at this timing, the "B" level and higher are distinguished from the "E" and "A" levels.

1. 2. 3 Details of the Reading Operation (Second Mode)

Figure 7:
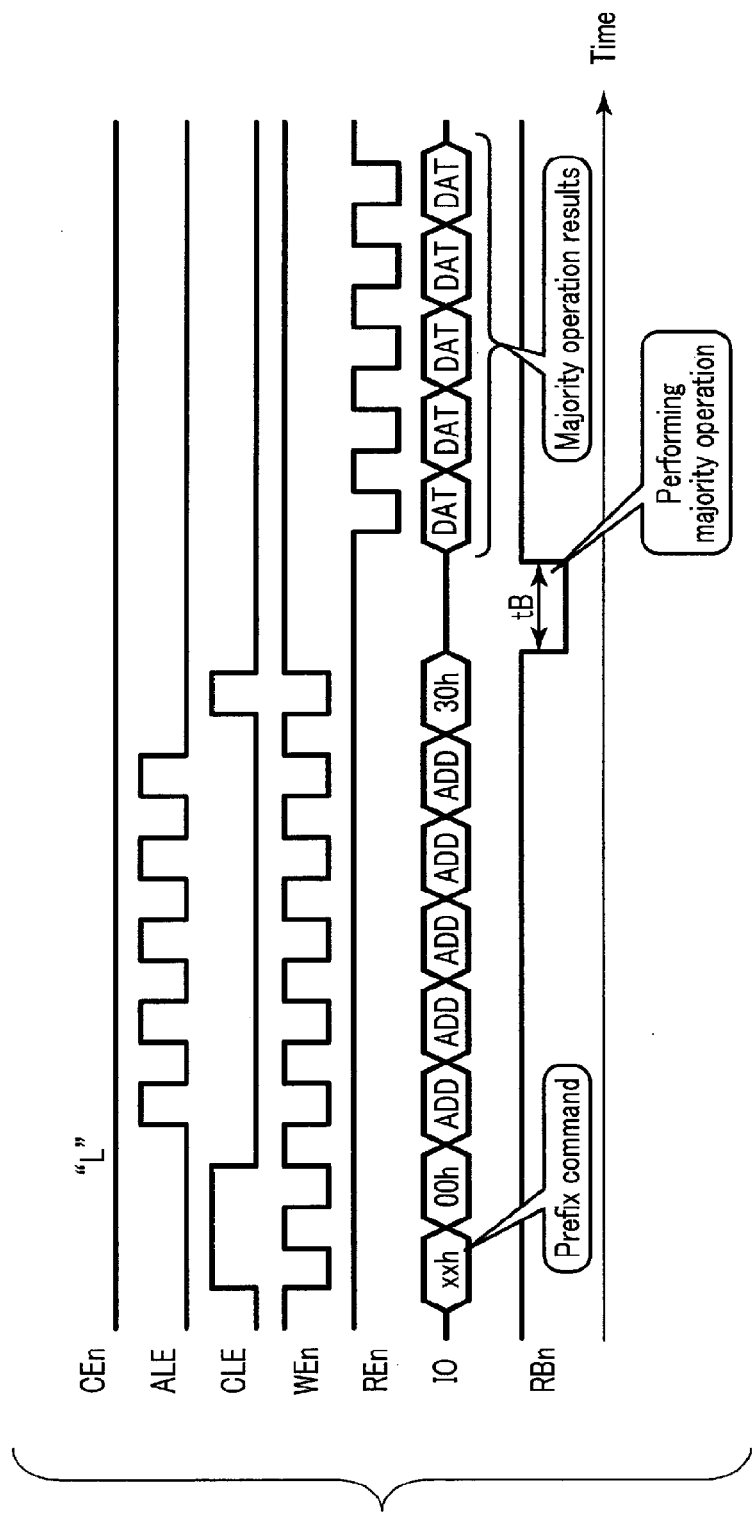
Figure 8:
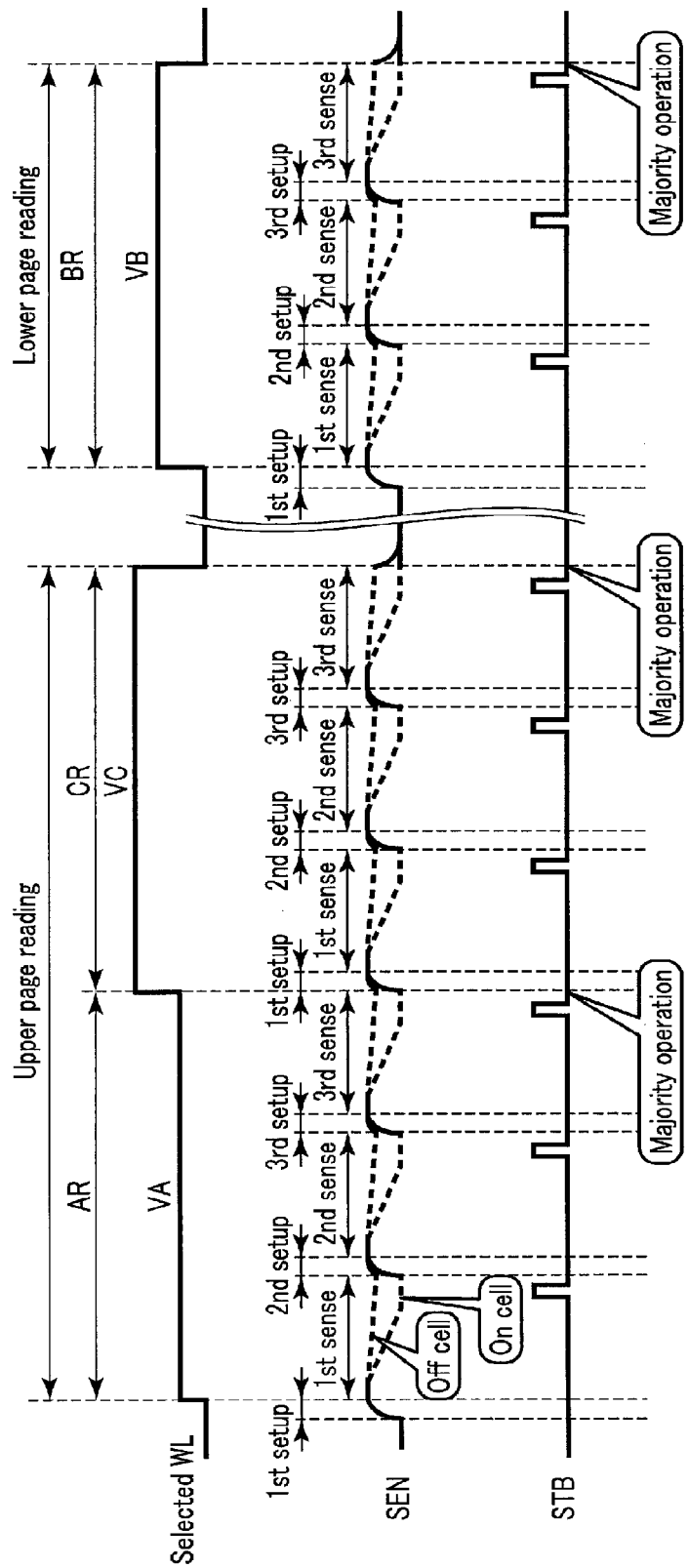

Now, details of the second mode will be described. FIG. 7 is a timing chart of signals on the NAND bus during the read operation in the second mode. FIG. 8 is a timing chart of the selected word line WL, the node SEN, and the signal STB. FIG. 8 illustrates changes in the potential at the node SEN in further detail.

A difference from the first mode described with reference to FIG. 5 and FIG. 6 is that, as shown in FIG. 7 and FIG. 8, the prefix command "xxh" is issued before issuance of the first read command "00h". Another difference is as follows. In the NAND flash memory 100, in response to the command "xxh", the signal STB is asserted three times during the read operation AR. The majority operation is performed on the data determined at these timings to determine values for the bits in the data held by each memory cell transistor MT, that is, the bits in one page of data. Similar operations are performed in the read operations CR and BR.

Furthermore, as shown in FIG. 8, one read operation includes a setup operation and a sense operation. In the setup operation, the node SEN is charged, and in the sense operation, the node SEN is set to a floating state (shown by a dashed line in FIG. 8) and discharged. The data is determined based on the change of the voltage potential at the node SEN. More specifically, when the corresponding selected memory cell is turned on, the potential at the node SEN decreases approximately to 0 V. On the other hand, when the corresponding selected memory cell is turned off, the potential at the node SEN only slightly decreases. Such an operation is repeated three times for each of the read operations AR, CR, and BR.

An operation of the sense amplifier 140 during the read operation in the second mode will be described using FIGS. 9 to 12. FIGS. 9 to 12 show internal operations of a selected block BLK and the latch circuits LDL, UDL, and XDL. In the following notation, "&" denotes a logical product operation, and "|" denotes a logical sum operation.

Figure 9:
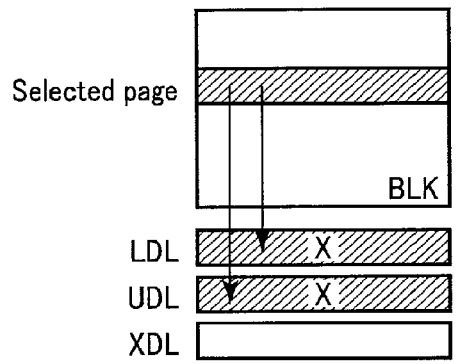
FIGS. 9 to 12 show internal operation of the memory cell array and the sense amplifier during the read operation according to the first embodiment.

First, as shown in FIG. 9, data is read in units of pages from any selected area into the sense amplifier section SA. The signal STB is asserted to determine the data. The data is transferred to the latch circuit SDL (=SEN), and inverted data (X (=/SDL="0" or "1") for the transferred data is transferred to the latch circuits LDL and UDL.

Figure 10:
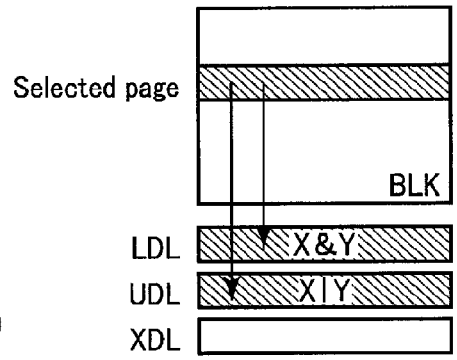

As further shown in FIG. 10, with the voltage on the word line WL maintained, the node SEN is recharged to read data into the sense amplifier section SA. Then, the signal STB is reasserted to determine the data. The data is transferred to the latch circuit SDL (=SEN). Then, the calculation section OP executes the logical product operation on inverted data "Y (=/SEN="0" or "1")" for the data in the latch circuit SDL and the data "X" in the latch circuit LDL. The calculation section OP allows the latch circuit LDL to hold a result of the operation ("X&Y"). Moreover, the calculation section OP executes the logical sum operation on the data "Y" and the data "X" in the latch circuit UDL, and allows the latch circuit UDL to hold a result of the operation ("X|Y").

Figure 11:
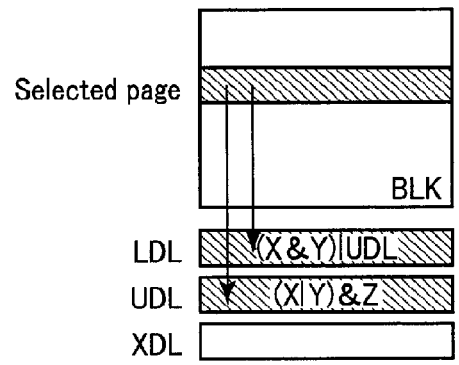
Figure 12:
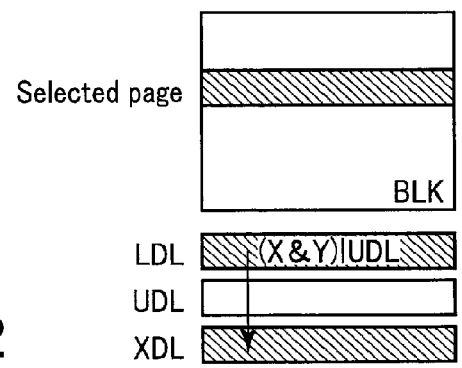

As further shown in FIG. 11, with the voltage on the word line WL maintained, the node SEN is recharged to read data into the sense amplifier section SA. Then, the signal STB is reasserted to determine the data. The data is transferred to the latch circuit SDL (=SEN). Then, the calculation section OP executes the logical product operation on inverted data "Z (=/SEN="0" or "1")" for the data in the latch circuit SDL and the data "X|Y" in the latch circuit UDL. The calculation section OP allows the latch circuit UDL to hold a result of the operation ("(X|Y)&Z"). Subsequently, the calculation section OP executes the logical sum operation on the data "X&Y" in the latch circuit LDL and the data "(X|Y)&Z" in the latch circuit UDL, and allows a result of the operation ("X&Y|UDL") to be held in the latch circuit LDL.

Thereafter, the data in the latch circuit LDL is transferred to the latch circuit XDL. The data is "X&Y|UDL"="XY|YZ|XZ". That is, a result of the majority operation on "X", "Y", and "Z" is transferred to the XDL.

1. 3 Effects of the Present Embodiment

The present embodiment reduces the adverse effect of noise during the read operation to allow improvement of operational reliability of the semiconductor storage device and the memory system. The present effect will be described below.

The configuration according to the present embodiment includes the first mode and the second mode for the read operation. In the second mode, read is performed three times on the same address, and the majority operation is performed on the read results for each bit to determine the value of each bit. Hence, even if erroneous read results from noise or the like at any timing, a final value can be determined to be a correct value.

The result of the majority operation is depicted in FIG. 13. In FIG. 13, the read result of the first read corresponds to "X" described above with reference to FIGS. 9 to 12, the read result of the second read corresponds to "Y" described above with reference to FIGS. 9 to 12, and the read result of the third read corresponds to "Z" described above with reference to FIGS. 9 to 12. As shown in FIG. 13, the final fixed data is selected from among "0" or "1" depending on which of "0" and "1" is counted more, as indicated by the three read results. Specifically, for example, when the value of the bit is determined to be "1" in the first read and to be "0" in the second and third reads, the value of the focal bit is fixed to "0" (case II). Furthermore, when the value of the bit is determined to be "1" in the first and second reads and to be "0" in the third read, the value of the focal bit is fixed to "1" (case IV).

When the results of the three read operations fail to match, the cause of the mismatch may be noise. In this regard, a single read operation has difficulty allowing determination of whether the read result has been inverted by the adverse effect of noise. However, the present embodiment performs the majority operation based on the number of times the data is determined to be "0" and the number of times the data is determined to be "1" to select the value with the larger number of times as the correct data. Therefore, the result of erroneous read caused by noise (shaded in FIG. 13) can be excluded.

Furthermore, performing three reads extends the period of time needed for the read, but the above-described effect can be obtained with this period of time minimized. That is, as shown in FIG. 8, when read is performed for a certain level, charging of the node SEN and assertion of the signal STB may be repeated with the potential on the word line kept the same. That is, for example, start-up of a voltage generation circuit and the like need not be performed for every three reads. Therefore, the read period can be shortened. By way of example, when the read period in the first mode is denoted by tA and the read period in the second mode is denoted by tB, for example, 2·tA>tB>tA.

Moreover, data reading is voluntarily performed a plural times on the NAND flash memory 100 side in response to single read instruction from the controller 200. Furthermore, the majority operation is executed by the NAND flash memory 100 without the need to receive any separate instruction from the controller 200. Therefore, an increase in loads on the controller 200 can be suppressed.

Moreover, the controller 200 can select one of the first and second modes using the prefix command. Therefore, the controller 200 is allowed to select the second mode only when needed. For example, the controller 200 selects the second mode when accurate reading is requested and selects the first mode when a high-speed operation is requested.

2. Second Embodiment

Now, a memory system according to a second embodiment will be described. The present embodiment relates to details of the sense amplifier 140 in the above-described first embodiment and variations of a command sequence. Only differences from the first embodiment will be described.

2. 1 Sense Amplifier 140

First, the details of the sense amplifier 140 will be described.

2. 1. 1 Configuration

FIG. 14 is a circuit diagram depicting a configuration example of the sense amplifier 140, particularly of the sense amplifier section SA.

As shown in FIG. 14, the sense amplifier section SA comprises n-channel MOS transistors 141 to 145, p-channel transistors 146, 147, and a capacitor element 148.

The transistor 141 controls a precharge potential on the bit line BL during data reading. A source of the transistor 141 is connected to the corresponding bit line BL. A signal BLC is provided to a gate of the transistor 141. A drain of the transistor 141 is connected to a node COM. The transistor 142 precharges the bit line BL. A signal BLX is provided to a gate of the transistor 142. A power supply voltage VDD is provided to a drain of the transistor 142. A source of the transistor 142 is connected to the node COM. The transistor 143 charges the capacitor element 148. A signal HLL is provided to a gate of the transistor 143. The power supply voltage VDD is provided to a drain of the transistor 143. A source of the transistor 143 is connected to the node SEN. The transistor 144 discharges the node SEN during data sensing. A signal XXL is provided to a gate of the transistor 144. A drain of the transistor 144 is connected to the node SEN. A source of the transistor 144 is connected to the node COM.

The capacitor element 148 is charged during precharging of the bit line BL. One electrode of the capacitor element 148 is connected to the node SEN. The other electrode is, for example, grounded.

The transistor 146 senses whether the read data is "0" or "1". A gate of the transistor 146 is connected to the node SEN. A source of the transistor 146 is connected to a drain of the transistor 147. A drain of the transistor 146 is connected to a drain of the transistor 145. The transistor 147 determines read data based on the potential at the node SEN. A signal /STB is provided to a gate of the transistor 147. The power supply voltage VDD is provided to a source of the transistor 147. The transistor 145 resets the latch circuits SDL, LDL, UDL. A signal RST is provided to a gate of the transistor 145. A source of the transistor 145 is grounded.

A connection node between the transistors 146 and 145 is connected to a bus. The transistors 146 and 145 are connected via the bus to the latch circuits SDL, LDL, UDL, and the like and the calculation section OP. Furthermore, for the transistor 145, the signal RST is set to the "H" level before data reading to provide 0 V to the bus. The 0 V is held in the latch circuits to initialize the latch circuits.

The signals BLC, BLX, HLL, XXL, RST, and STB are provided by the sequencer 170.

2. 1. 2 Operation

Figure 15:
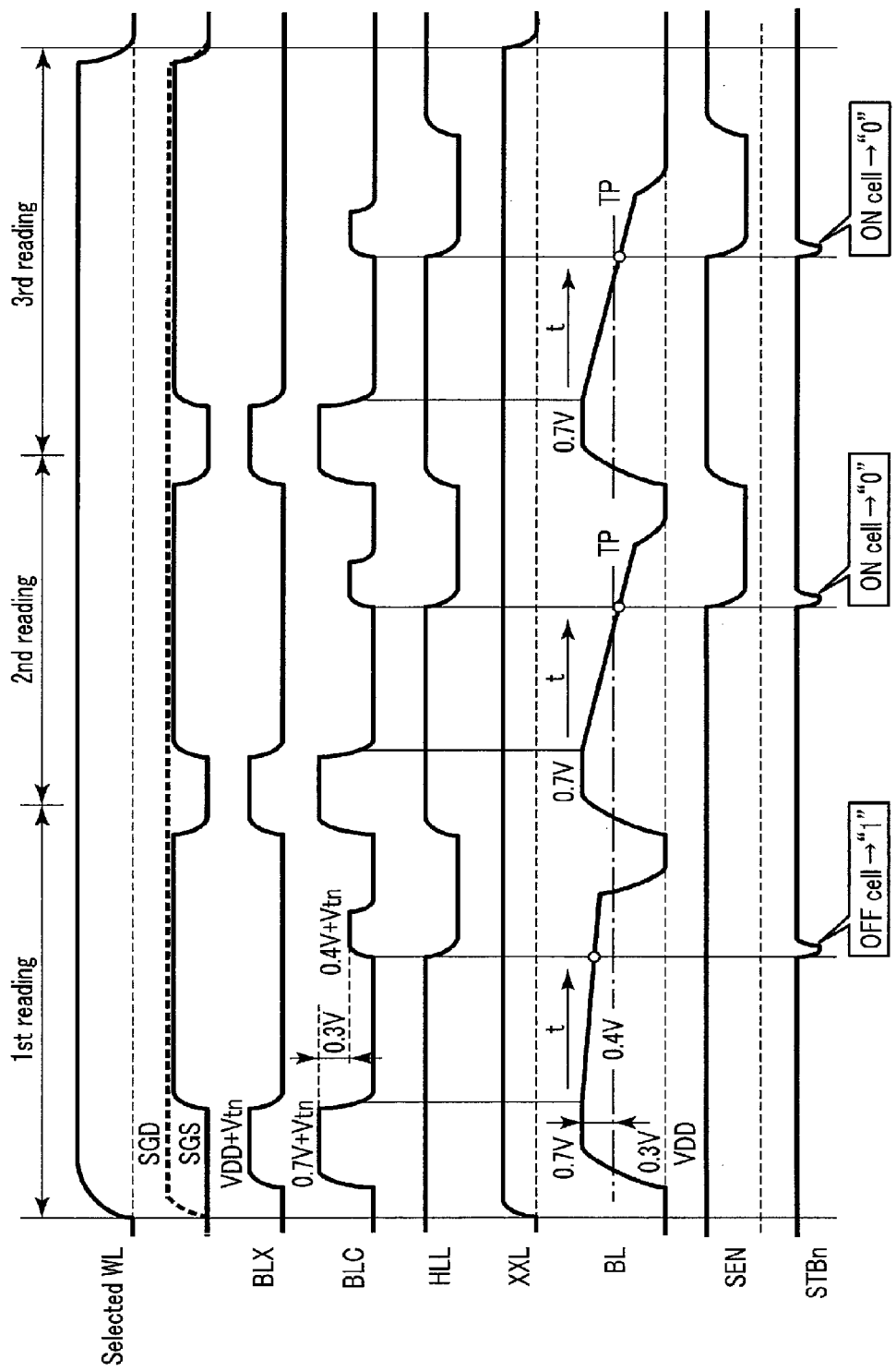

Now, details of operation of the sense amplifier 140 during read will be described using FIG. 15, with focus placed on the operation of the sense amplifier section SA. FIG. 15 is a timing chart showing potentials of various signals and potentials at various nodes and illustrating a case where three reads are consecutively performed in the second mode.

As shown in FIG. 15, first, the row decoder 120 selects one of the word lines WL in the selected block SLK, applies a read voltage VCGRV (in the example in FIG. 4, one of the voltages VA, VB, and VC) to the selected word line WL, and applies a voltage that sets the selection transistor ST1 to an ON-state, to the selection gate line SGD. Furthermore, a voltage VREAD that sets the memory cell transistors MT to the ON-state regardless of held data is applied to the unselected word lines WL.

Subsequently, for example, the sequencer 170 increases the potentials of the signals BLX and BLC to predetermined levels, for example, (VDD+Vth) and (0.7 V+Vth), respectively. Vth is a threshold voltage for the transistors 141 to 144. As a result, the bit line BL is precharged to approximately 0.7 V via a current path through the transistors 142, 141. Furthermore, the sequencer 170 sets the potential of the signal HLL to (VDD+Vth) to set the transistor 143 to the ON-state to charge the node SEN. The signal XXL is at, for example, (VDD+Vth), and the transistor 144 is in the ON-state.

Then, the sequencer 170 sets the signals BLX and BLC to 0 V, and applies a voltage that sets the selection transistor ST2 to the ON-state. Then, when a memory cell transistor MT connected to the selected word line WL is in the ON-state, a cell current flows through the corresponding bit line BL to reduce the potential on the bit line BL. On the other hand, when the memory cell transistor MT connected to the selected word line WL is in the OFF-state, no cell current flows through the corresponding bit line BL, with the potential on the bit line BL kept approximately at a precharge level.

When a predetermined sense period t has elapsed, the sequencer 170 sets the signal HLL to 0 V, and sets the signal BLC to, for example, (0.4 V+Vth). Then, when a memory cell transistor MT connected to the selected word line WL is in the ON-state, the potential on the corresponding bit line BL is sufficiently lower than 0.4 V (trip point), and thus, a current flows from the node SEN to the source line SL to reduce the potential at the node SEN. On the other hand, when the memory cell transistor MT is in the OFF-state, the potential on the corresponding bit line BL is higher than 0.4 V, and thus, the transistor 141 is in a cut-off state, with the node SEN remaining charged at a high potential. Moreover, the sequencer 170 sets the signal /STB to the "L" level to set the transistor 147 to the ON-state.

As a result, when the potential at the node SEN is lower, the transistor 146 is in the ON-state, allowing the "H" level to be transferred to the latch circuit SDL via the bus. On the other hand, when the node SEN maintains a high potential, the transistor 146 is in the OFF-state, and thus, the latch circuit SDL continues to hold the "L" level.

In the second mode, the above-described operation is performed three times as shown in FIG. 15. During this period, the potential on the word line WL is constant at VCGRV. Each time the read operation is repeated, the node SEN is charged. The example in FIG. 15 illustrates an example where the memory cell transistor MT is determined to be in the OFF-state during the first read operation and to be in the ON-state during the second and third read operations.

Furthermore, for the upper page reading, the operation illustrated in FIG. 15 is repeated twice. That is, as described in the first embodiment using FIG. 6, the voltage VA is applied to the selected word line WL during the first read operation and the voltage VC is applied to the selected word line WL during the second read operation.

With reference to FIG. 15, the example where the potential on the bit line BL is sensed has been described. It is also possible to sense a current flowing through the bit line BL. In the example of FIG. 15, the bit line BL is constantly charged, with the potential on the bit line BL kept equal to the precharge potential. In this state, the node SEN is connected to the bit line BL. When a current flows from the node SEN to the bit line BL, the potential at the node SEN decreases. When no current flows from the node SEN to the bit line BL, the potential at the node SEN is kept high.

As the above-described sense amplifier, for example, a configuration is applicable which is described in U.S. patent application Ser. No. 13/052,148 entitled "THRESHOLD DETECTING METHOD AND VERIFY METHOD OF MEMORY CELL", filed on March, 2011. The contents of the patent application are entirely incorporated herein by reference.

2. 2 Examples of the Command Sequence

Now, several examples of the command sequence different from the example described in the first embodiment using FIG. 7 will be described.

First Example

First, a first example will be described using FIG. 16. FIG. 16 is different from FIG. 7 described in the first embodiment in that a further command is issued between the prefix command and the first read command.

When a command "yyh" is issued, the NAND flash memory 100 operates in an SLC mode. The SLC mode is an operation mode in which each of the memory cell transistors MT holds 1-bit (2-level) data.

When commands "01h", "02h, and "03h" are issued, each of the memory cell transistors MT in the NAND flash memory 100 holds 3-bit (8-level) data. The command "01h" instructs the NAND flash memory to read a lower bit (lower page) among the 3 bits. The command "02h" instructs the NAND flash memory to read a middle bit (middle page) among the 3 bits. The command "03h" instructs the NAND flash memory to read an upper bit (upper page) among the 3 bits.

A command "04h" may further be issued. In this case, each of the memory cell transistors MT holds 4-bit (16-level) data. The command "04h" instructs the NAND flash memory to read a top bit (top page) that is the most significant bit among the 4 bits.

When such a command is not issued and the command "00h" is issued immediately after issuance of the command "xxh", the NAND flash memory 100 operates in an MLC mode. Each of the memory cell transistors MT is set to an operation mode in which the memory cell transistor MT holds 2-bit (4-level) data (as shown in FIG. 4).

Second Example

Figure 17:
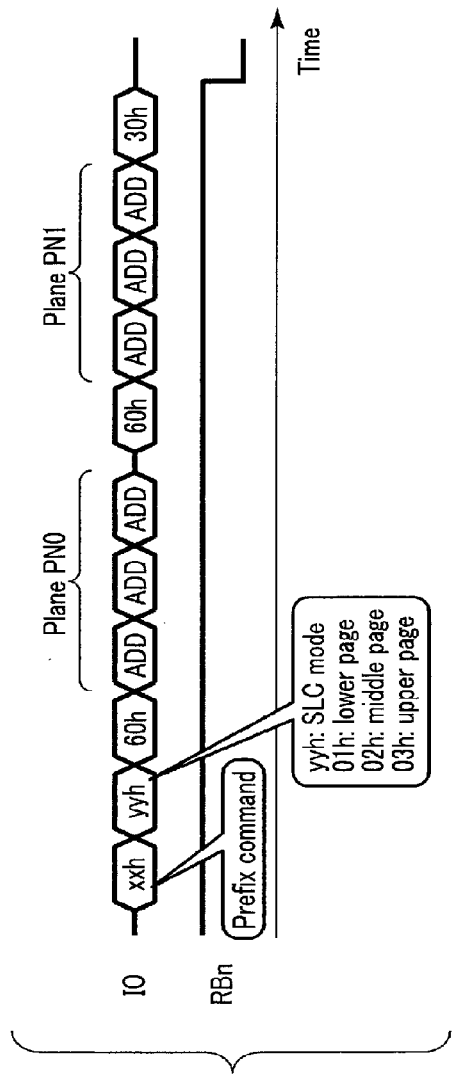
Figure 18:
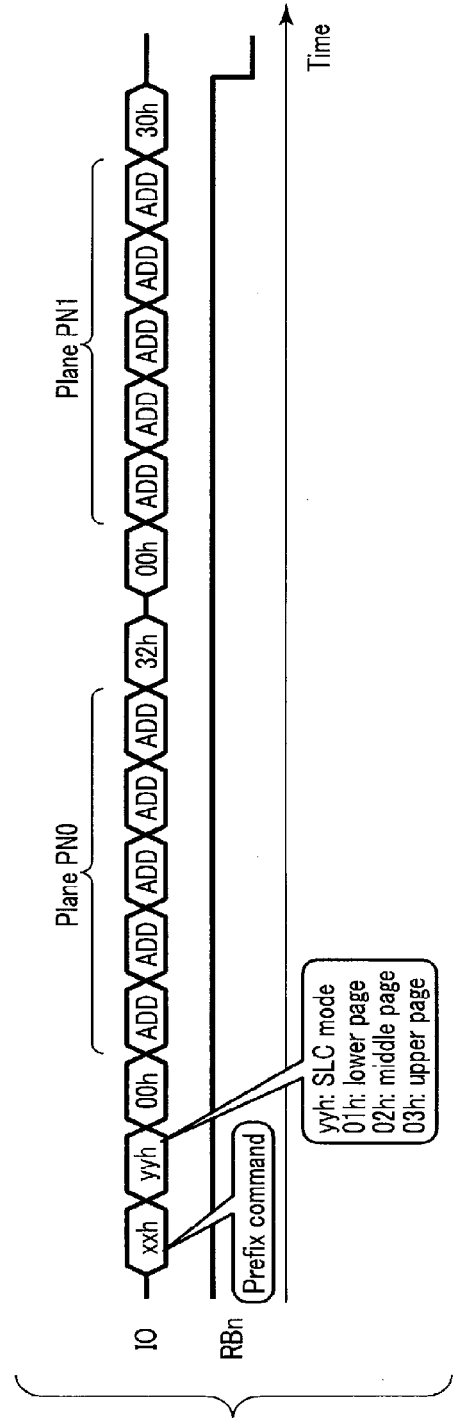

A second example relates to a case where the NAND flash memory 100 includes a plurality of planes. Each of the planes includes the memory cell array 110, the row decoder 120, the driver circuit 130, and the sense amplifier 140. The plurality of planes can operate independently of one another. One of the planes may exclusively operate (single plane operation) or the planes may operate in parallel (simultaneously). FIG. 17 and FIG. 18 show command sequences for parallel read of data from two planes PN0 and PN1.

In the example in FIG. 17, the command "yyh" (or "01h", "02h", "03h", or the like) is issued as needed after issuance of the prefix command "xxh", and subsequently, a command "60h" is issued. The command "60h" is a first read command during a multi-plane operation (corresponding to "00h" during a single plane operation). After the issuance of the command "60h", the address of an area in the plane PN0 which is to be accessed is transmitted. Then, subsequently to the issuance of the command "60h", the address of an area in the plane PN1 which is to be accessed is transmitted.

Thereafter, a second read command "30h" is issued to read data from the planes PN0 and PN1. At this time, the majority operation is performed on the read data from each of the planes PN0 and PN1.

In the example in FIG. 18, after issuance of the command "00h", the address of the area in the plane PN0 which is to be accessed is transmitted, and then, a command "32h" is transmitted. The command "32h" is a command indicating that addressing for one plane is ended and that addressing for another plane follows. Then, subsequently to the issuance of the command "00h", the address of the area in the plane PN1 which is to be accessed is transmitted. Thereafter, a second read command "30h" is issued to read data from the planes PN0 and PN1.

Third Example

In the above-described first embodiment, the case of page-by-page reading has been described where the controller 200 issues the read command for each page, for example, as shown in FIG. 8. However, in a third example, single read command allows a plurality of page data to be read. Such a read method is referred to as sequential reading.

Figure 19:
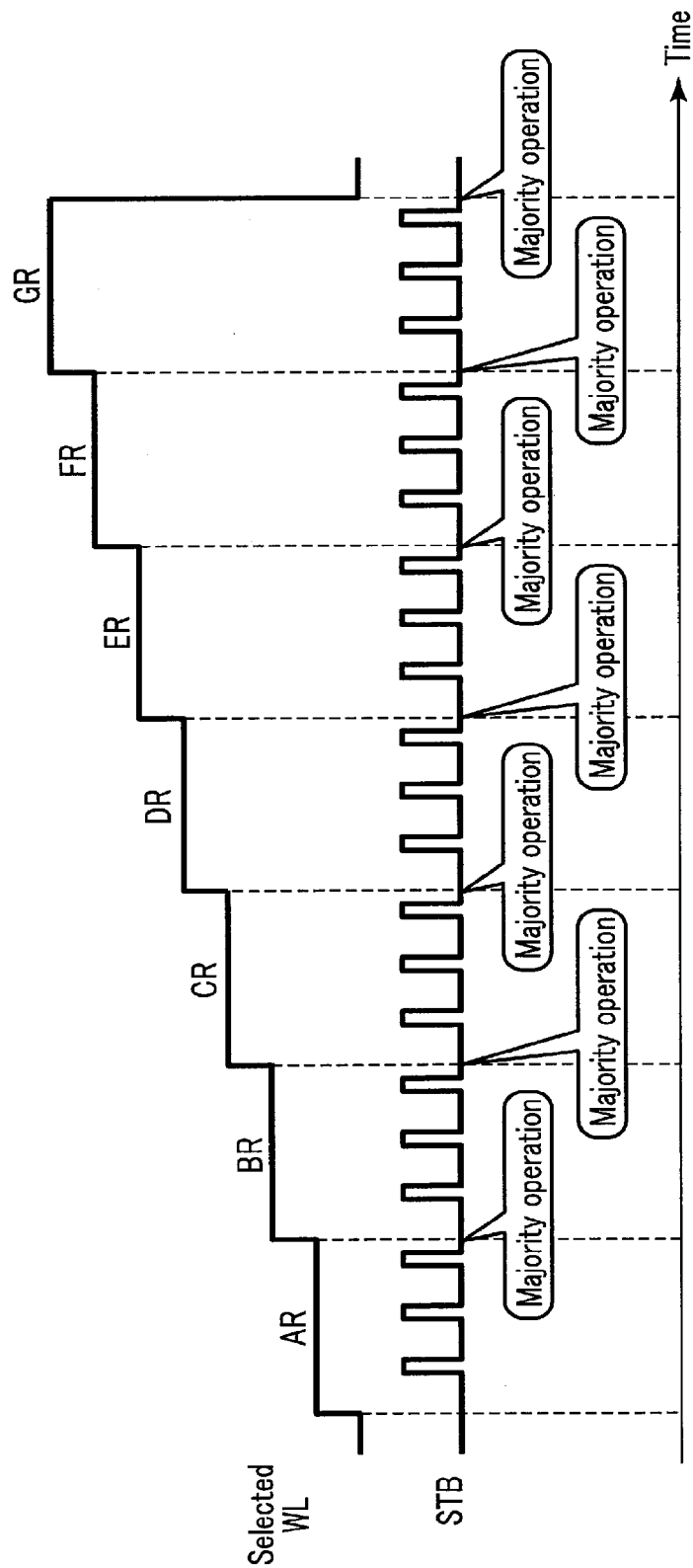

FIG. 19 is a timing chart of the word line WL and the signal STB during read in the third example, illustrating a case where each of the memory cell transistors MT can hold 3-bit (8-level) data. Data expressed by the 3 bits are referred to as "Er", "A", "B", "C", "D", "E", "F", and "G" levels in ascending order of threshold voltage. "Er" level corresponds to the data-erased state. Read voltages between the levels are referred to as VA, VB, VC, VD, VE, VF, and VG.

Then, as shown in FIG. 19, voltages VA to VG are sequentially applied to the selected word line WL to read data. Reading operations using the voltages VA to VG are referred to as read operations AR to GR, respectively. The read operation AR determines whether a threshold for the memory cell transistors MT is equal to or lower than the voltage VA or higher than the voltage VA. The read operation BR determines whether the threshold for the memory cell transistors MT is equal to or lower than the voltage VB or higher than the voltage VB. The read operation CR determines whether the threshold for the memory cell transistors MT is equal to or lower than the voltage VC or higher than the voltage VC. The remaining read operations are similar to the read operations AR to CR, and the last read operation GR determines whether the threshold for the memory cell transistors MT is equal to or lower than the voltage VG or higher than the voltage VG. Then, combination of results of the read operations AR to GR determines lower page data, the middle page data, and upper page data.

The majority operation described in the first embodiment is also applicable to such sequential reading as described above. That is, as shown in FIG. 19, in each of the read operations AR to GR, the signal STB is asserted three times, and three sense results are stored in the sense amplifier 140. Then, the sense amplifier 140 performs the majority operation on the sense results and determines the results to be setup data for the read operations AR to GR.

2. 3 Effects of the Present Embodiment

The method described above in the first embodiment is applicable to NAND flash memories with various configurations.

3. Third Embodiment

Now, a memory system according to a third embodiment will be described. The present embodiment applies, to distribution read, the read method using the majority operation described in the first and second embodiments. Only differences from the first and second embodiments will be described below.

3. 1 Distribution Read

In the first embodiment, the threshold distribution for the memory cell transistors MT has been described using FIG. 4. In FIG. 4, threshold distributions in the levels are independent of one another, allowing the data to be accurately determined using the voltages VA, VB, and VC.

However, the threshold for the memory cell transistors MT fluctuates due to the adverse effects of various disturbances or the like. As a result, for the threshold distributions of data in FIG. 4, the distribution may extend or move, causing the adjacent distributions to overlap. Even in such a case, ECC is used to correct errors to allow the data to be correctly read. In an alternative method, read is performed again using an appropriate read voltage. This is referred to as retry read. The retry read enables a reduction in error occurrence probability for read data. To enable the retry read, the extents of the distributions need to be checked (in other words, a position (voltage) is determined which corresponds to an intersection point between two distributions and at which the number of fail bits is minimized; this is sometimes referred to as Vth tracking) so as to allow the appropriate read voltage to be found. The distribution read is a method used to search for the read voltage.

Figure 20:
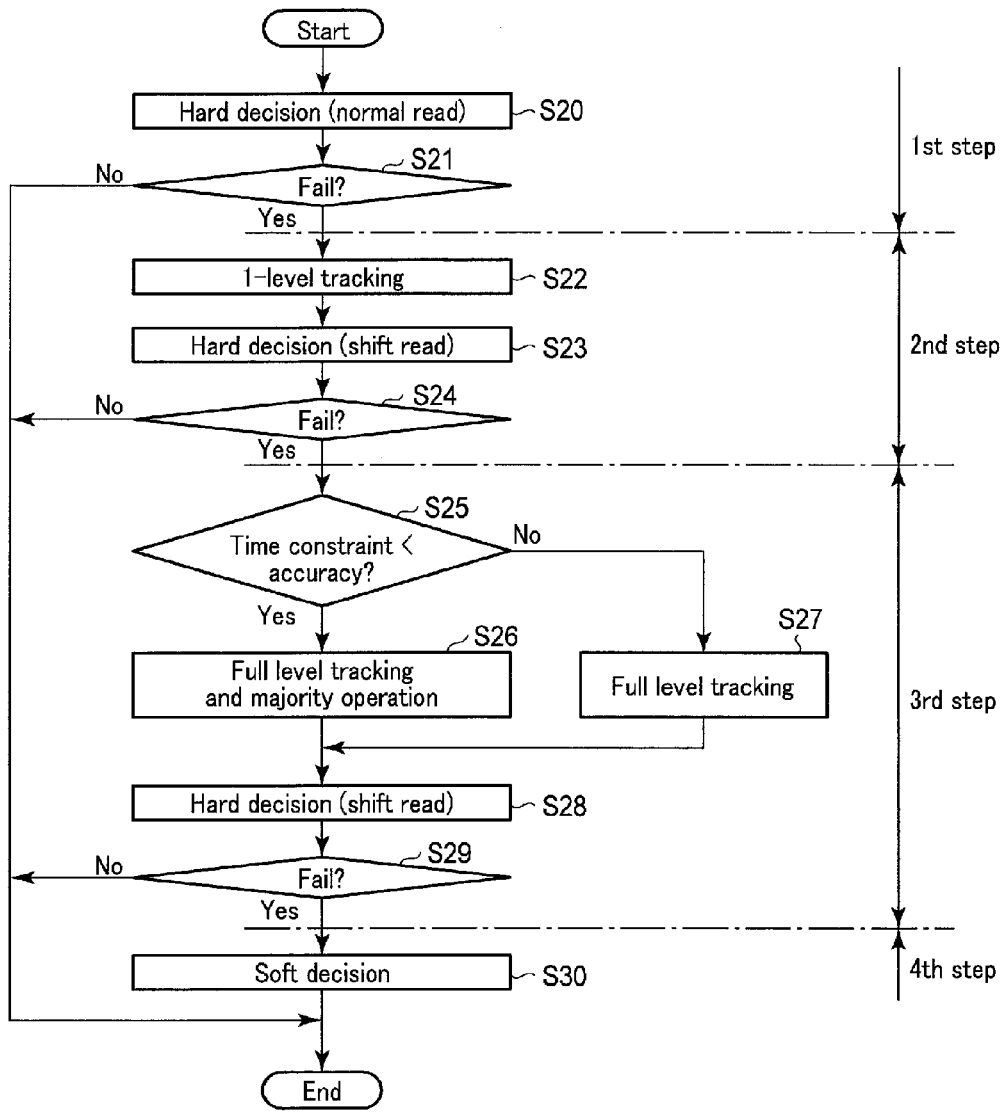

FIG. 20 is a flowchart of a read voltage search method for the retry read, and FIG. 21 shows FIG. 20 in further detail.

A processing method according to the present embodiment roughly includes four steps. The steps will be sequentially described.

<First Step>

A first step is a hard decision process (step S20). That is, the controller 200 issues the normal read command, and in response, the NAND flash memory 100 reads one page of data (step S20-1 in FIG. 21). A case of the page-by-page reading will be described below. However, the process is similarly applicable to the sequential reading.

Figure 22:
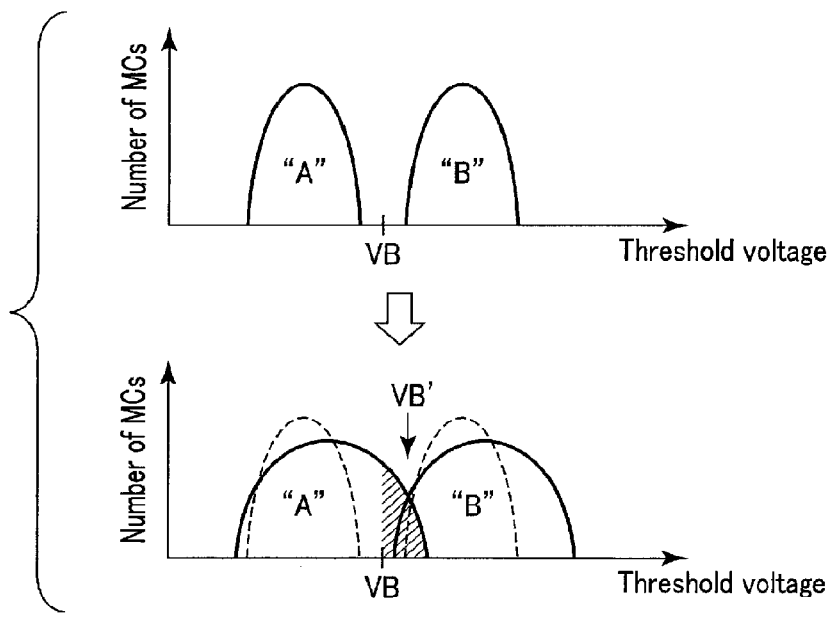
FIG. 22 is a graph illustrating a threshold distribution for memory cells.

In the NAND flash memory 100, data is read using the predetermined read voltage VCGRV, and the read data is transmitted to the controller 200. Subsequently, the controller 200 executes an ECC process on the received data (step S20-2 in FIG. 21). When an error fails to be corrected by the ECC process (step S21, YES, step S20-3 in FIG. 21), the process proceeds to a second step. When the error thus fails to be corrected, such a case as illustrated in FIG. 22 is possible. In FIG. 22, for example, threshold distributions obtained immediately after writing of an "A" level and a "B" level are assumed to be as shown in an upper figure of FIG. 22. However, the threshold distributions are assumed to be extended by disturbance or the like as shown in a lower figure of FIG. 22. Then, reading with the voltage VB results in an error in memory cell transistors MT corresponding to a shaded area in the lower figure. Then, if the number of resulting error bits exceeds the number of bits for which errors can be corrected by the ECC circuit 260, the data fails to be accurately corrected. Therefore, in such a case, the position (voltage) of the intersection point is searched for where the two threshold distributions overlap, and a voltage near the intersection point is determined to be a read voltage VB'. A process in which the read voltage B' is found to allow the data to be correctly read is a second step and subsequent steps described below.

<Second Step>

The second step is 1-level tracking (step S22).

For example, for threshold distributions of 2-bit data as described with reference to FIG. 4, three voltages are present which correspond to the respective intersection points between the threshold distributions. In the 1-level tracking, one of the intersection points (for example, the intersection point between the "A" level and the "B" level) is searched for to detect the appropriate read voltage (for example, a voltage VB'). The other read voltages (voltages VA' and VC') are estimated based on the voltage VB'. This is the 1-level tracking.

Figure 23:
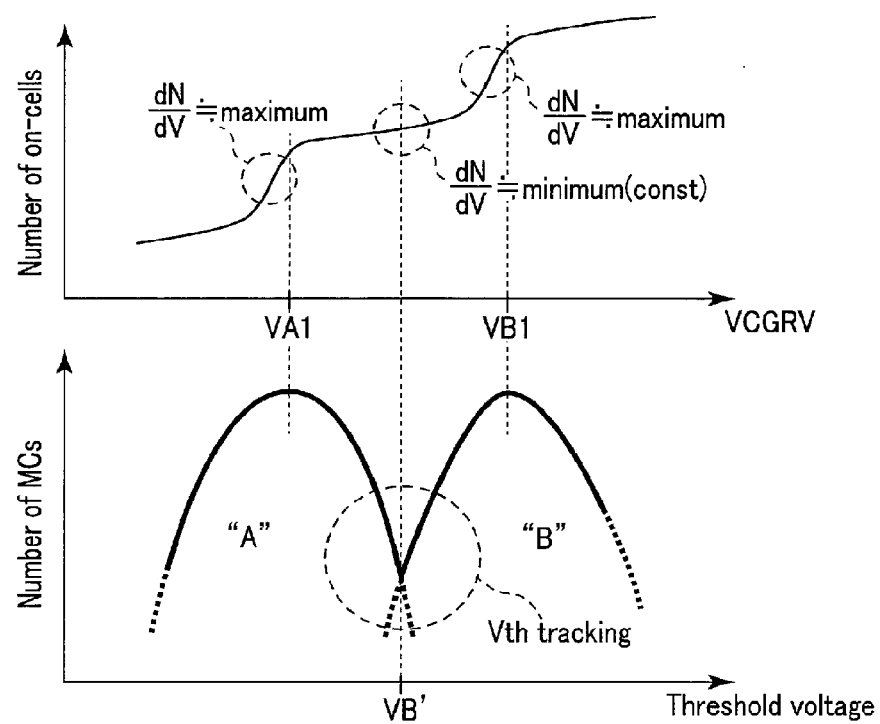

A concept of a manner of determining the appropriate read voltage VB' will be described using FIG. 23. FIG. 23 is a graph illustrating the number of ON-cells (a cumulative value for the number of memory cells in ON-state) with respect to the voltage VCGRV applied to the selected word line WL, and an "A" level threshold distribution and a "B" level threshold distribution in association with the number of ON-cells.

As shown in an upper figure of FIG. 23, as the voltage VCGRV on the selected word line WL is increased, at a voltage slightly lower than a voltage VA1 that is a median of the "A" level (a voltage with the highest distribution probability), the number of ON-cells increases rapidly and dN/dV is maximized (N denotes the number of ON-cells, and V denotes the voltage on the selected word line WL). As the voltage VCGRV is increased, the increase rate of the number of ON-cells decreases and has a minimum value at a certain value. The increase rate at the voltage VCGRV is zero when the "A" level and the "B" level do not overlap. On the other hand, when the "A" level and the "B" level overlap, the increase rate has a certain minimum value that is not zero (>0). As the voltage VCGRV is further increased, the increase rate of the number of ON-cells increases again, and dN/dV is maximized at a voltage slightly lower than a voltage VB1 that is a median of the "B" level.

Such threshold distributions as shown in the lower figure of FIG. 23 can be determined based on the above-described changes in the cumulative value of the number of ON-cells. That is, threshold distributions are obtained in which the voltage slightly higher than the voltage at which dN/dV has the maximum value corresponds to the median of each of the "A" and "B" levels and in which the voltage at which dN/dV has the minimum value corresponds to the intersection point between the "A" level and the "B" level. The voltage at the intersection point, that is, the voltage VCGRV at which the increase rate of the cumulative value of the number of ON-cells is minimized, is the VB' to be found.

Specifically, in the 1-level tracking, the controller 200 issues a first test read command different from the normal read command, and in response, the NAND flash memory 100 reads one page of data (step S22-1 in FIG. 21). In step S22-1, information is read from the NAND flash memory 100, indicating whether the corresponding memory cell transistor MT has been turned on or off as a result of reading with a read voltage shifted by some predetermined amount from the normal read voltage for certain levels. For example, in the example in FIG. 4, when the voltage at the intersection point between an "E" level and "A" level is searched for, the read operation is performed using a value shifted from the voltage VA by a predetermined value ΔVA. As described above, in this case, the voltages at the intersection points, each of which is between the other levels, can be estimated, and thus, the read operation with the voltages VB and VC is not performed. This shift amount ΔVA may be designated, for example, by the first test read command.

The above-described operation is repeated, for example, approximately four times with the voltage VA shifted. Thus, the voltage at the intersection point between adjacent threshold distributions is searched for. This is illustrated in FIG. 24. The example in FIG. 24 illustrates a case where the voltage at the intersection point between the "A" level and the "B" level is searched for, that is, an example where the appropriate value for the voltage VB' is searched for. An upper figure of FIG. 24 shows the number of ON-cells (the number of memory cells in ON-state) with respect to the voltage VCGRV on the selected word line WL. A lower figure of FIG. 24 shows a histogram indicating the number of memory cells turned on for the first time when the voltage on the word line WL is shifted by one step, and the resultant threshold distributions.

As shown in FIG. 24, first, the read operation is performed using a voltage V3 shifted by ΔVB from the voltage VB used when the normal read command is issued. The number of ON-cells at this time is assumed to be N3. Then, the read operation is performed using a voltage V2 shifted from the voltage V3 in a plus or minus direction (in the example in FIG. 24, the minus direction) by ΔVB. The number of ON-cells at this time is assumed to be N2. Then, the number of memory cells newly turned on when the voltage on the selected word line WL increases from V2 to V3 is (N3−N2). Subsequently, the controller 200 performs the read operation using the voltage V1 shifted from the voltage V2 in the minus direction by ΔVB. The number of ON-cells at this time is assumed to be N1. Then, the number of memory cells newly turned on when the voltage across the selected word line WL increases from V1 to V2 is (N2−N1). Given that (N2−N1)>(N3−N2), the voltage at which dN/dV=minimum is expected to be at least higher than the voltage V2. Therefore, the controller 200 performs the read operation using the voltage V4 further shifted from the voltage V3 in the plus direction by ΔVB. Given that the number of ON-cells at this time is N4 and that (N4−N3)>(N3−N2), such a histogram as shown in the lower figure of FIG. 24 is obtained.

As a result, such threshold distributions as shown in the lower figure of FIG. 24 are estimated. Based on the distributions, the controller 200 estimates that the position between the voltages V2 and V3 corresponds to the position where the dN/dV=minimum described with reference to FIG. 23. The controller 200 sets the value between the voltages V3 and V2 to be the appropriate read voltage VB'. Moreover, the controller 200 estimates the voltages VA' and VC' based on a relation between the voltages VB and VB' and sets the voltages VA' and VC' to be the appropriate read voltages (step S22-2 in FIG. 21).

Then, the controller 200 executes a hard decision process (retry read) using the read voltages VA', VB', and VC' obtained in the 1-level tracking (step S23). The contents of the hard decision process are substantially similar to the contents of the hard decision process in the first step. However, in the second step, instead of the normal read command, a shift read command is issued, and information designating the read voltages VA', VB', and VC' is transmitted to the NAND flash memory 100 (the VA' and VC' are designated for the upper page reading, and the VB' is designated for the lower page reading).

In the NAND flash memory 100, one page of data is read using the voltages designated by the controller 200 and transmitted to the controller 200.

Upon failing to correct the error (step S24, YES, step S23-3 in FIG. 21) as a result of the ECC process on the received data (step S23-2 in FIG. 21), the controller 200 proceeds to a third step.

In the first read (step S20), the shift read may also be performed, for example, using a shift value stored in the controller 200. Furthermore, the read voltages obtained in the above-described 1-level tracking may be applied to a selected read target page, and for the other pages, the appropriate read voltages may be determined at another time by the 1-level tracking.

<Third Step>

The third step includes full level tracking and further involves the majority operation described in the first embodiment as needed. For example, the majority operation is performed (step S26) when read accuracy is more important than time constraints (step S25, YES) and is not performed (step S27) when the time constraints are more demanding (step S25, NO). Thereafter, the hard decision is executed using the read voltages obtained in step S26 or S27 (step S28).

The full level tracking refers to execution of the process described in the second step on a plurality of intersection points using smaller voltage shift amount. This is shown in FIG. 25 and FIG. 26.

As shown in FIG. 25, threshold distributions for the "E" level, the "A" level, the "B" level, and the "C" level overlap one another. In the second step, one of the three intersection points in the threshold distributions is searched for, whereas, in a fourth step, Vth tracking is performed on all of the plurality of intersection points (three intersection points in the present example) to search for the appropriate read voltages VA', VB', and VC'. For example, when the voltage at any of the intersection points (for example, the VB') is appropriately determined in the second step, the remaining voltages (voltage VA' and VC') may be determined in the third step. That is, in the upper figure of FIG. 25, a histogram is created between the voltages VE1 and VA1, and the voltage VA' is determined based on the histogram. A histogram is created between the voltages VA1 and VB1, and the voltage VB' is determined based on the histogram. A histogram is created between the voltages VB1 and VC1, and the voltage VC' is determined based on the histogram.

At this time, in the full level tracking, the number of voltage shifts in the Vth tracking for each intersection point is approximately 4 to 5 in the second step, whereas the number of voltage shifts in the third step is larger than the number of voltage shifts in the second step and is, for example, in the present example, 20, and the read voltage is shifted in smaller shift amounts (and over a wider voltage range), as shown in FIG. 26. As described above, the full level tracking involves creating histograms using a small step size to determine more precise threshold distributions, allowing the appropriate read voltages to be more accurately determined.

Furthermore, the 1-level tracking and the full level tracking differ in a search algorithm for the read voltages and thus in the order of applying voltages to the selected word line. In the 1-level tracking, the voltage for the selected word line is shifted until a voltage Vn is found at which the number of bits at a certain voltage V(n−1) minus the number of bits at a voltage V(n−2) is larger than the number of bits at Vn minus the number of bits at the voltage V(n−1) (n is a natural number and the voltage value increases consistently with n). Moreover, after such a voltage Vn is found, the voltage on the selected word line is shifted until the voltage Vm is found at which the number of bits at a voltage V(m+1) minus the number of bits at the voltage Vm is larger than the number of bits at Vm minus the number of bits at the voltage V(m−1). In case of FIG. 26, Vn equals to Vm, but Vn may differ from Vm. Therefore, as shown in a middle figure of FIG. 26, the read operation is performed at least four times, and the voltage across the selected word line is also complicatedly shifted instead of being monotonically increased or reduced.

In contrast, in the full level tracking, the voltage on the selected word line is monotonically increased (or monotonically reduced) in certain steps from an initial value (the value represented as initial DAC) to a final value (the value represented as final DAC) as shown in a lower figure of FIG. 26.

In the full level tracking, the controller 200 issues a second test read command, and in response, the NAND flash memory 100 reads one page of data. FIG. 21 illustrates an example of a case where the majority operation is performed. As shown in FIG. 21, the controller 200 issues the prefix command described in the first embodiment with reference to FIG. 7, along with the second test read command, which is different from the first test read command. The second test read command is a command that instructs the NAND flash memory 100 to execute the read operation for the full level tracking. In response to the second test read command, the NAND flash memory 100 reads one page of data. At this time, the NAND flash memory 100, provided with the prefix command, executes reading three times for an address provided along with the second test read command (steps S26-1 to S26-3), and performs the majority operation on read results (step S26-4). The NAND flash memory 100 then transmits a result of the majority operation to the controller 200.

That is, in the above-described process, the NAND flash memory 100 shifts the read voltage in steps AV smaller than the steps in step S22-1, while, for example, first shifting the voltage VA 20 times. Information indicating whether the memory cell transistor MT has been turned on or off at the current read voltage is read from the NAND flash memory 100 into the controller 200. Similar operations are performed on the voltages VB and VC.

Then, the controller 200 executes the hard decision process (retry read) using the read voltages VA', VB', and VC' obtained in the above-described full level tracking (step S28). The contents of the hard decision process are substantially similar to the contents of the hard decision process in the first step. However, in the third step, information designating the read voltages VA' VB', and VC' is transmitted to the NAND flash memory 100. When the ECC process (step S28-2 in FIG. 2) results in a failure to correct the error (step S29, YES, step S28-3 in FIG. 21), the process proceeds to a fourth step.

<Fourth Step>

In a fourth step, the controller 200 executes a soft decision process based on results of the above-described first to third steps (step S30). Then, the controller 200 sets up the read data based on a result of the soft decision process.

3. 2 Command Sequence for the Distribution Read

Now, a command sequence for the above-described distribution read will be described. The command sequence described below corresponds to the first test read command and the second test read command in FIG. 21. The majority operation may also be performed in the 1-level tracking, and in that case, the following sequence may also be used.

The command sequence is not limited to the command sequence for the distribution read described below, but any read scheme may be used which provides, for example, such a threshold distribution as depicted in FIG. 25.

First Example

FIG. 27 illustrates a command sequence according to a first example. As shown in FIG. 27, "XXh" is issued as the prefix command. This prefix command instructs the NAND flash memory to execute the majority operation as described in the first embodiment.

Then, the controller 200 issues a command "X0h" declaring designation of the read voltage. Then, the controller 200 issues and inputs a DAC (D/A converter) value "DAC1" corresponding to the read voltage VCGRV to the NAND flash memory 100 as data. The subsequent sequence is substantially similar to the corresponding sequence in FIG. 5, and after input of an address, a command "X1h" is transmitted which allows the read operation to be performed using one read voltage designated by the DAC value.

The present sequence allows the NAND flash memory to perform the distribution read using the read voltage corresponding to the "DAC1". For example, the NAND flash memory, provided with the prefix command, uses the voltage corresponding to the "DAC1" to execute reading three times and performs the majority operation for the reads.

The controller 200 repeats the above-described sequence a needed number of times. In the example in FIG. 24, the sequence is repeated four times. In each sequence, DAC values "DAC3", "DAC2", "DAC1", and "DAC4" designating the voltages V3, V2, V1, and V4 are sequentially input to the NAND flash memory 100.

Of course, the command sequence according to the first example can be applied to the full level tracking by repeating the command sequence a needed number of times. In this case, the DAC value transmitted in the first sequence is the initial DAC value described with reference to FIG. 26. The DAC values transmitted in the last sequence is the final DAC value.

Second Example

FIG. 28 shows a command sequence according to a second example. The present example is applicable to, for example, the full level tracking.

As shown in FIG. 28, "XXh" is issued as the prefix command, and a command "X2h" is subsequently issued. The command "X2h" is a command declaring the input of the initial read voltage for the distribution read and the step size of the read voltages. Then, the controller 200 issues a command "X3h" declaring designation of the initial read voltage. Then, the controller 200 issues and inputs a DAC (D/A converter) value "initialDAC" corresponding to the initial read voltage VCGRV, to the NAND flash memory 100 as data. Then, the controller 200 issues a command "X4h" declaring designation of a step size (offset) at which the read voltage is shifted. The controller 200 then inputs a DAC value "StepDAC" corresponding to the step size to the NAND flash memory 100 as data. The subsequent sequence is similar to the corresponding sequence in FIG. 27.

In the present sequence, the NAND flash memory performs the distribution read using a read voltage corresponding to "initialDAC".

In repeating the distribution read while shifting the read voltage, the controller 200 issues a command "X6h". Upon receiving the "X6h", the NAND flash memory 100 executes a distribution command while shifting the read voltage by a step size provided in "Step DAC". Upon receiving the "X6h" command, the NAND flash memory 100 can perform reading of data from the memory cell array in parallel with transmission of data to the controller 200. Issuance of the "X6h" needs no address input. In other words, when the "X6h" is issued, the word line WL corresponding to the last input address is continuously selected.

3. 3 Effects of the Present Embodiment

As described above, the majority operation described in the first embodiments is applicable to the shift read.

As described above, when the threshold distribution for the memory cells is fluctuated by a disturbance or the like, accurate reading of data may be difficult with the initially set read voltage VCGRV. The distribution read is a technique used in this case to track the threshold distribution. The threshold distribution resulting from the distribution read allows the appropriate read voltage VCGRV to be determined. This determination method is as described above with reference to FIG. 24.

In this case, when erroneous read results from noise, determining the appropriate read voltage is difficult. FIG. 29 is a threshold distribution resulting from Vth tracking performed without using the majority operation. As shown in FIG. 29, erroneous read results from noise, and the number of ON-cells is very small at a certain read voltage (in FIG. 29, a portion shown by a circle). Thus, erroneous read may form a "trough" in the threshold distribution at a point otherwise corresponding to a "peak". Then, during the search for the appropriate read voltage described in FIGS. 24 to 26, the trough portion resulting from the erroneous read may be determined to be a trough in the threshold distribution. Consequently, the voltage corresponding to this portion may be determined to be the appropriate read voltage.

However, in the present embodiment, even if erroneous read occurs, the majority operation is performed to allow correct determination of whether the cell is an ON-cell or an OFF-cell. FIG. 30 illustrates this. That is, FIG. 30 represents Vth tracking results obtained by using three read operations per page and the majority operation under the same conditions as those in FIG. 29. As shown in FIG. 30, the erroneous trough in FIG. 29 has disappeared as a result of the majority operation.

Therefore, the read voltage used for the retry read can be set to a more appropriate value, enabling a reduction in the possibility of a failure in the read operation.

Furthermore, in the 1-level tracking, the selected word line voltage during repeated read operations does not increase or decrease monotonically. Therefore, the sequence in FIG. 27 is desirably used which allows the appropriate voltage to be designated. In contrast, the voltage for the full level tracking may increase or decrease monotonically, and thus, both the sequences in FIG. 27 and FIG. 28 can be applied to this voltage. The sequence in FIG. 28 is preferably used particularly for high-speed operations.

For the details of the distribution read and the Vth tracking described in the present embodiment, a method is applicable which is described in, for example, U.S. patent application Ser. No. 13/544,147 filed on Jul. 9, 2012 and is entitled "SEMICONDUCTOR MEMORY DEVICE WHICH STORES MULTIVALUED DATA". The contents of the patent application are entirely incorporated herein by reference.

4. Modifications and the Like

As described above, the memory system according to the above-described embodiments includes: a semiconductor memory device (100 in FIG. 1) including a memory cell array including memory cells capable of holding data; and a controller (200 in FIG. 1) configured to control the semiconductor memory device. The semiconductor memory device reads data a plurality of times from a first area designated by a first address in the memory cell array in response to a first read instruction (xxh+00h in FIG. 7) from the controller (S11 to S14 in FIG. 3), performs a majority operation on the read results (S15 in FIG. 3), and transmits data based on the majority operation result to the controller as read data from the first area (FIG. 3).

In the present configuration, even if any of a plurality of read operations is erroneous, this erroneous read result is prevented from being reflected in the final data by the majority operation. Therefore, more accurate data can be read, allowing operational reliability of the semiconductor storage device to be improved.

The above-described embodiments may be variously modified. In the above-described embodiments, data is read three times from the same page so as to allow the majority operation to be performed. However, data may be read five times. Furthermore, this number of times is preferably odd but may be even.

Moreover, in the method described in the third embodiment using FIG. 20 and FIG. 21, the majority operation is performed in the full level tracking in the third step, by way of example. However, the majority operation may be applied to the 1-level tracking in the second step or to both the full level tracking in the third step and the 1-level tracking in the second step.

However, the 1-level tracking is often performed in order to achieve faster read, and in contrast, the full level tracking is often performed in order to achieve high accuracy over time. Therefore, the majority operation is desirably applied to the full level tracking. Of course, even for the 1-level tracking, whether or not to use the majority operation may be determined based on the determination in step S25 in FIG. 20.

Furthermore, in the above-described embodiments, the NAND flash memory 100 performs the read operation three times in response to one read instruction from the controller 200, by way of example. However, the controller 200 may issue the read instruction a needed number of times. The present method allows the controller 200 to optionally determine the number of bits used for the majority operation.

Moreover, in the above-described first to third embodiments, the majority operation is performed, and based on the result of the majority operation, the values of the bits in the page are determined, by way of example. However, the embodiments are not limited to the majority operation. For example, the value may be determined to be correct exclusively when all the bits match with one another. Such examples are illustrated in FIG. 31 and FIG. 32.

FIG. 31 illustrates a case where memory cells holding "0" data are counted. As shown in FIG. 31, in case I, the read data is "0" in all of three reads. Therefore, the bit is concluded to be "0". In other cases II to VIII, "1" data is included in any of the three reads. Therefore, in these cases, the bit is concluded to be "1".

FIG. 32 illustrates a case where memory cells holding "1" data are counted. As shown in FIG. 32, in case VIII, the read data is "1" in all of three reads. Therefore, the bit is concluded to be "1". In cases I to VII, "0" data is included in any of the three reads. Therefore, in these cases, the bit is concluded to be "0".

The configuration in FIG. 31 can be implemented by the calculation section OP in the sense amplifier 140 by performing a logical product operation on the bits resulting from the three reads. Furthermore, the configuration in FIG. 32 can be implemented by the calculation section OP by first inverting the bits resulting from the three reads and then performing a logical product operation on the inverted bits.

In addition, in the above-described embodiments, the majority operation is performed in the NAND flash memory 100, by way of example. Therefore, in this case, three reads are executed on the same page, and three pages of data are held in the sense amplifier 140. However, only one page of data that is the result of the majority operation is transmitted from the NAND flash memory 100 to the controller 200. However, the majority operation may be performed by the controller 200. In this case, three-times-read data are transmitted from the NAND flash memory 100 to the controller 200. However, the former method is preferable in view of efficient use of the NAND bus. That is, the need to transfer the read data from the NAND flash memory 100 to the controller 200 is eliminated, enabling a reduction in read time.

Furthermore, in the above-described embodiments, each of the memory cell transistors MT holds 2-bit data by way of example. However, of course, the memory cell transistor MT may hold 1-bit data or data of 3 or more bits.

Moreover, in the above-described embodiments, the NAND flash memory has been described as the semiconductor storage device. However, the semiconductor storage device is not limited to the NAND flash memory and can be applied to other semiconductor memories in general and further to various storage devices other than semiconductor memories.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a semiconductor memory device including a memory cell array including memory cells capable of holding data; and
a controller configured to control the semiconductor memory device,
wherein the semiconductor memory device reads data a plurality of times from a first area designated by a first address in the memory cell array in response to a first read instruction from the controller, performs a majority operation on the read results, and transmits data based on the majority operation result to the controller as read data from the first area.

2. The system according to claim 1, wherein the semiconductor memory device is capable of reading data in units of page,
in reading data, the controller issues the first read instruction and a page address designating any of the pages, and
the semiconductor memory device executes reading a plurality of times to read the page designated by the page address, and performs the majority operation among the read results for each bit to obtain one page of data.

3. The system according to claim 1, wherein the semiconductor memory device further includes word lines each connected to gates of the memory cells,
bit lines each connected to drains of the memory cells, and
a sense amplifier configured to determine read data based on a current flowing through or a voltage on the bit line and to receive a first control signal to fix data, and
when the first read instruction is issued, the first control signal is asserted a plurality of times with a read voltage applied to a selected word line.

4. The system according to claim 1, wherein, when receiving a second read instruction different from the first read instruction from the controller, the semiconductor memory device reads data once from the first area and does not perform the majority operation.

5. The system according to claim 1, wherein the first read instruction is issued when searching for a read voltage.

6. The system according to claim 1, wherein, when a read operation performed on the first area in the memory cell array using a first read voltage is failed,
the controller issues the first read instruction to determine a second read voltage from data based on the majority operation result, and performs a read operation on the first area using the second read voltage.

7. The system according to claim 6, wherein, when receiving the first read instruction, the semiconductor memory device shifts the first read voltage a first number of times, and for each shifted read voltage the semiconductor memory device reads data a plurality of times from the first area and performs the majority operation based on the plurality of read results, and
the controller determines the second read voltage based on the majority operation results obtained for the first number of times.

8. The system according to claim 7, wherein, when the read operation using the second read voltage is failed, the controller issues the second read instruction,
when received the second read instruction, the semiconductor memory device reads data from the first area while shifting the first read voltage a second number of times which is larger than the first number of times, and
the controller updates the second read voltage based on the read results obtained by shifting the first read voltage for the second number of times.

9. The system according to claim 8, wherein, when the read operation on the first area using the updated second read voltage is failed, the controller determines data using a soft-decision process.

10. A memory system comprising:
a semiconductor memory device including a memory cell array including memory cells capable of holding data; and
a controller configured to control the semiconductor memory device,
wherein the semiconductor memory device reads data a plurality of times from a first area in the memory cell array designated by a first address in response to a first read instruction from the controller,
determines, in each of the plurality of read operations, whether data held by each of the memory cells is at a first logic level or a second logic level, and
determines that the corresponding memory cell holds the first logic level when determined that the data in the memory cell is at the first logic level in all of the plurality of read operations and determines that the corresponding memory cell holds the second logic level when determined that the data in the memory cell is at the second logic level in at least one of the plurality of read operations.

11. The system according to claim 10, wherein the semiconductor memory device is capable of reading data in units of page,
in reading data, the controller issues the first read instruction and a page address designating one of pages, and
the semiconductor memory device executes a reading operation a plurality of times on the page designated by the page address and determines, for each bit, whether or not the memory cell holds the second logic level in order to obtain page data.

12. The system according to claim 10, wherein the semiconductor memory device further includes word lines each connected to gates of the memory cells,
bit lines each connected to drains of the memory cells, and
a sense amplifier configured to determine read data based on a current flowing through or a voltage on the bit line and to fix data by receiving a first control signal, and
when the first read instruction is issued, the first control signal is asserted the plurality of times with a read voltage applied to a selected word line.

13. The system according to 10, wherein, when receiving a second read instruction different from the first read instruction, the semiconductor memory device reads data once from the area to determine data held in the corresponding memory cell.

14. The system according to claim 10, wherein the first read instruction is issued when searching for a read voltage.

15. The system according to claim 10, wherein, when a read operation performed on the first area in the memory cell array using a first read voltage is failed,
the controller issues the first read instruction to determine a second read voltage from data based on the plurality of read results, and performs a read operation on the first area using the second read voltage.

16. The system according to claim 15, wherein, when receiving the first read instruction, the semiconductor memory device shifts the first read voltage a first number of times, and for each shifted voltage the semiconductor memory device reads data a plurality of times from the first area, and
the controller determines the second read voltage based on a result of determination of whether or not each of the bit in the read results obtained in reading the first number of times contains the second logic level.

17. The system according to claim 16, wherein, when the read operation using the second read voltage is failed, the controller issues the second read instruction,
when receiving the second read instruction, the semiconductor memory device reads data from the first area while shifting the first read voltage a second number of times which is larger than the first number of times, and
the controller updates the second read voltage based on the obtained read results obtained by shifting for the second number of times.

18. The system according to claim 17, wherein, when the read operation on the first area using the updated second read voltage is failed, the controller determines data using a soft-decision process.

* * * * *